(12) United States Patent
Yamada et al.

(10) Patent No.: US 8,083,964 B2
(45) Date of Patent: Dec. 27, 2011

(54) METAL-POLISHING LIQUID AND POLISHING METHOD

(75) Inventors: Toru Yamada, Haibara-gun (JP);
Makoto Kikuchi, Haibara-gun (JP);
Tadashi Inaba, Haibara-gun (JP);
Takahiro Matsuno, Ashigarakami-gun (JP); Takamitsu Tomiga, Haibara-gun (JP); Kazutaka Takahashi, Haibara-gun (JP)

(73) Assignee: Fujifilm Corporation, Tokyo (JP)

( * ) Notice: Subject to any disclaimer, the term of this patent is extended or adjusted under 35 U.S.C. 154(b) by 905 days.

(21) Appl. No.: 12/055,930

(22) Filed: Mar. 26, 2008

(65) Prior Publication Data

US 2008/0242090 A1    Oct. 2, 2008

(30) Foreign Application Priority Data

Mar. 30, 2007 (JP) ................... 2007-095284

(51) Int. Cl.
*C03C 15/00* (2006.01)

(52) U.S. Cl. ....... 216/88; 252/79.1; 252/79.2; 252/79.3; 252/79.4; 438/689; 438/690; 438/691; 438/692

(58) Field of Classification Search ............ 216/88; 252/79.1–79.4; 438/689–692
See application file for complete search history.

(56) References Cited

U.S. PATENT DOCUMENTS

| | | | | |
|---|---|---|---|---|
| 5,492,939 A * | 2/1996 | Stanga et al. | ................. | 521/112 |
| 5,575,885 A | 11/1996 | Hirabayashi et al. | | |
| 6,238,571 B1 * | 5/2001 | Olmez et al. | ................. | 210/722 |
| 6,790,769 B2 * | 9/2004 | Kurashima et al. | ........... | 438/633 |
| 7,297,669 B2 * | 11/2007 | Martyak et al. | ............... | 510/175 |
| 7,544,307 B2 * | 6/2009 | Akatsuka | ........................ | 252/79 |
| 7,547,335 B2 * | 6/2009 | Seki et al. | ....................... | 51/307 |
| 2004/0244300 A1 * | 12/2004 | Ichiki et al. | ..................... | 51/307 |

FOREIGN PATENT DOCUMENTS

WO    00/53691 A1    9/2000
WO    01/12739 A1    2/2001

OTHER PUBLICATIONS

Byron J. Palla et al. Journal of Colloid and Interface Science, vol. 223, (2000) pp. 102-111.*

* cited by examiner

*Primary Examiner* — Nadine G Norton
*Assistant Examiner* — Maki Angadi
(74) *Attorney, Agent, or Firm* — Sughrue Mion, PLLC

(57) ABSTRACT

A metal-polishing liquid used for chemical-mechanical polishing of a conductor film of copper or a copper alloy in a process for manufacturing a semiconductor device, the metal-polishing liquid comprising: (1) an amino acid derivative represented by the formula (I); and (2) a surfactant,

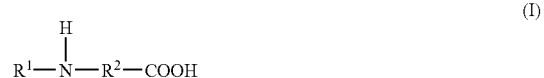

(I)

wherein, in the formula (I), $R^1$ represents an alkyl group having 1 to 4 carbon atoms and $R^2$ represents an alkylene group having 1 to 4 carbon atoms.

15 Claims, No Drawings

METAL-POLISHING LIQUID AND POLISHING METHOD

CROSS-REFERENCE TO RELATED APPLICATION

This application claims priority under 35 USC 119 from Japanese Patent Application No. 2007-095284, the disclosure of which is incorporated by reference herein.

BACKGROUND

1. Technical Field

The present invention relates to a metal-polishing liquid and a polishing process therewith, in more detail, a metal-polishing liquid used in a wiring process in semiconductor device production and a polishing process therewith.

2. Related Art

Recently, in the development of semiconductor devices typified by semiconductor integrated circuits (hereinafter, appropriately referred to as "LSI"), in order to achieve smaller size and higher speed, higher densification and higher integration by miniaturization of wirings and lamination are in demand. As a technique for this, various techniques such as chemical mechanical polishing (hereinafter, appropriately referred to as "CMP") are in use. The CMP is a process that is used to polish metal thin films used in insulating thin films ($SiO_2$) and wirings in the production of semiconductor devices to remove superfluous metal thin films when a substrate is smoothed and wirings are formed (see, for instance, U.S. Pat. No. 4,944,836).

The metal-polishing liquid used in the CMP generally includes abrasive grains (such as alumina) and an oxidizing agent (such as hydrogen peroxide). The mechanism of the polishing by means of the CMP is considered to be that the oxidizing agent oxidizes a metal surface and a film of the oxide is removed by the abrasive grains to carry out polishing (see, for instance, Journal of Electrochemical Society, Vol. 138(11), pages 3460 to 3464 (1991)).

However, when the CMP is applied by use of the metal-polishing liquid containing such solid abrasive grains, in some cases, polishing scratches, a phenomenon where an entire polishing surface is polished more than necessary (thinning), a phenomenon where a polished metal surface is not planar, that is, only a center portion is polished-deeper to form a dish-like concave (dishing), or a phenomenon where an insulating material between metal wirings is polished more than necessary and a plurality of wiring metal surfaces forms dish-like concaves (erosion) may be caused.

Furthermore, when the metal-polishing liquid containing solid abrasive grains is used, in a cleaning process that is usually applied to remove the polishing liquid remaining on a polished semiconductor surface, the cleaning process becomes complicated and, furthermore, in order to dispose of the liquid after the washing (waste liquid), the solid abrasive grains have to be sedimented and separated; accordingly, there is a problem from the viewpoint of cost.

In order to overcome such problems of the conventional abrasive grains, for instance, a metal surface polishing process where a polishing liquid that does not contain abrasive grains and dry etching are combined is disclosed (see, for instance, Journal of Electrochemical Society, Vol. 147 (10), pages 3907 to 3913 (2000)). Furthermore, as a metal-polishing liquid that does not contain abrasive grains, a metal-polishing liquid that is made of hydrogen peroxide/malic acid/benzotriazole/ammonium polyacrylate and water, and a polishing process therewith are disclosed (see, for instance, Japanese Patent Application Laid-Open (JP-A) No. 2001-127019). According to the polishing processes described in these documents, a metal film of a convex portion of a semiconductor substrate is selectively subjected to the CMP and a metal film of a concave portion is left to form a desired conductor pattern. However, since the CMP advances due to friction with a polishing pad that is mechanically far softer than a conventional one that contains abrasive grains, there is a problem in that a sufficient polishing speed is difficult to obtain.

As wiring metals, so far, tungsten and aluminum have been generally used in the interconnect structure. However, in order to achieve higher performance, LSIs that use copper which is lower in wiring resistance than these metals have been developed. As a process for wiring copper, for instance, a damascene process disclosed in JP-A No. 2-278822 is known. Furthermore, a dual damascene process where a contact hole and a wiring groove are simultaneously formed in an interlayer insulating film and a metal is buried in both is in wide use. As a target material for such copper wiring, a copper target having high purity of five ninths or more has been used. However, recently, as the wirings are miniaturized to carry out further densification, the conductivity and electric characteristics of the copper wiring require improvement; accordingly, a copper alloy where a third component is added to high-purity copper is under study. Simultaneously, a high-performance metal-polishing means that can exert high productivity without contaminating the high-precision and high-purity material is in demand.

Furthermore, recently, in order to improve the productivity, a wafer diameter when LSIs are produced is enlarged. At present, a diameter of 200 mm or more is generally used, and production at a magnitude of 300 mm or more as well has been started. As the wafer diameter is made larger like this, a difference in polishing speeds at a center portion and a periphery portion of the wafer tends to occur; accordingly, achievement of uniformity in the polishing is becoming important.

As a chemical polishing process that does not apply mechanical polishing means to copper and a copper alloy, a process that makes use of a chemical solvent action is known (see, for instance, JP-A No. 49-122432). However, in the chemical polishing process that depends only on the chemical solvent action, in comparison with the CMP where a metal film of a convex portion is selectively chemomechanically polished, a concave portion is polished, that is, dishing is caused; accordingly, a large problem remains with respect to the planarity.

Furthermore, an aqueous dispersion element for chemical mechanical polishing, which contains an organic compound that inhibits the polishing pad from deteriorating, is disclosed (see, for instance, JP-A No. 2001-279231). However, even when the polishing aqueous dispersion element is used, there remains a concern in that the dishing phenomenon where a metal of a wiring portion is excessively polished to hollow out like a dish may be caused.

Other than the above, in order to planarize a polished surface, a working liquid that contains a chelating agent selected from iminodiacetate useful for correcting a wafer surface and salts thereof (see, for instance, Japanese Patent Application National Phase Publication No. 2002-538284) and a chemical mechanical polishing composition containing α-amino acid (see, for instance, JP-A No. 2003-507894) are proposed. Owing to these technologies, the polishing performance in the copper wiring may be improved.

Furthermore, usually, after the copper wiring is subjected to high-performance polishing, tantalum or a tantalum alloy that is frequently used as a barrier metal of the copper wiring and copper are precisely polished to planarize the vicinity of the wiring. Accordingly, realization of a polishing liquid that has, at the end of the copper polishing, polishing selectivity between copper and tantalum (hereinafter, appropriately referred to as "copper/tantalum polishing selectivity") in which copper is readily ground and tantalum is difficult to grind is desired.

SUMMARY

The present inventions have been made in view of the above circumstances and provide a metal-polishing liquid and a metal polishing method.

A first aspect of the invention provides a metal-polishing liquid used for chemical-mechanical polishing of a conductor film of copper or a copper alloy in a process for manufacturing a semiconductor device, the metal-polishing liquid comprising: (1) an amino acid derivative represented by the formula (I); and (2) a surfactant,

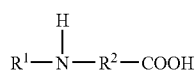

(I)

wherein, in the formula (I), $R^1$ represents an alkyl group having 1 to 4 carbon atoms and $R^2$ represents an alkylene group having 1 to 4 carbon atoms.

DETAILED DESCRIPTION

After intensive studies under the circumstances above, the inventors have found that it was possible to solve the problems above by using a metal-polishing liquid described below and a polishing method therewith, and completed the invention.

Hereinafter, exemplary embodiments of the invention will be described in detail.

[Metal-Polishing Liquid]

The metal-polishing liquid of the present invention is a metal-polishing liquid used for chemical-mechanical polishing of a conductor film of copper or a copper alloy in a process for manufacturing a semiconductor device, the metal-polishing liquid comprising:

(1) an amino acid derivative represented by the formula (I); and (2) a surfactant:

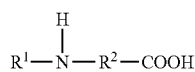

(I)

wherein in the formula (I), $R^1$ represents an alkyl group having 1 to 4 carbon atoms and $R^2$ represents an alkylene group having 1 to 4 carbon atoms.

A metal-polishing liquid of the present invention will now be described, though it is not limited by the following description.

A metal-polishing liquid of the present invention is constituted by containing the components (1) an amino acid derivative represented by general formula (I) above and (2) a surfactant as essential components and, usually containing water. The metal-polishing liquid of the present invention may further contain other component as desired. Preferred examples of other components include additives such as a compound (e.g. an aromatic heterocyclic compound) added as a so-called passivation film forming agent, an oxidizer, an acid, an alkali, a buffering agent and abrasive grains. The respective components (essential components and optional components) that the metal-polishing liquid contains may be used alone or in combination of at least two kinds thereof.

In the invention, the "metal-polishing liquid" includes not only a polishing liquid used in the polishing (namely, a polishing liquid diluted as needed) but also a concentrated liquid of the metal-polishing liquid.

The concentrated liquid of the metal-polishing liquid means a liquid that is prepared higher in a concentration of a solute than a polishing liquid when used in the polishing and is used in the polishing after dilution with water or an aqueous solution. The dilution factor is generally in the range of 1 to 20 times by volume.

In the specification of the invention, the term "concentration" and "concentrated liquid" are used in accordance with follow conventional expressions that mean a higher "concentration" and a more "concentrated liquid" compared with a usage state and are used in a manner that differs in meaning from a general terminology that accompanies a physical concentrate operation such as vaporization.

Hereinafter, the respective constituents contained in a metal-polishing liquid of the invention will be described. First, the respective components (1), Amino-acid Derivate represented by Formula (I) and (2) Surfactant that are essential components in the metal-polishing liquid of the invention will be sequentially described.

<(1) Amino-Acid Derivate Represented by Formula (I)>

The metal-polishing liquid of the invention contains an amino-acid derivative represented by a formula (I) below (hereinafter, appropriately referred to as "particular amino-acid derivative").

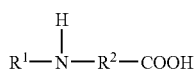

(I)

In the formula (I), $R^1$ represents an alkyl group having 1 to 4 carbon atoms and $R^2$ represents an alkylene group having 1 to 4 carbon atoms.

$R^1$ represents an alkyl group having 1 to 4 carbon atoms and specific examples thereof include methyl group, ethyl group, n-propyl group, i-propyl group, n-butyl group, s-butyl group, i-butyl group and t-butyl group. Among these, methyl group, ethyl group, n-propyl group and n-butyl group are preferred. Methyl group, ethyl group and n-propyl group are more preferable and methyl group and ethyl group are still more preferable.

$R^2$ represents an alkylene group having 1 to 4 carbon atoms, and the alkylene group may be straight-chain or branched. Specific examples of the alkylene groups represented by $R^2$ include methylene, ethylene, propylene, isopropylene, and butylene (isobutylene, n-butylene, i-butylene, s-butylene or t-butyelene) groups, among which methylene, ethylene, propylene, butylenes and n-butylene groups are preferable, methylene, ethylene, propylene and butylenes groups are more preferable and methylene and ethylene groups are still more preferable.

$R^2$ may further contain a substituent group, for example, a carboxy, hydroxyl, sulfo or alkoxy group.

A preferable combination of $R^1$ and $R^2$ in general formula (I) is that $R^1$ is a methyl, ethyl, n-propyl or n-butyl group and $R^2$ is a methylene, ethylene, propylene or butylene (or n-butylene) group. More preferable combination is that $R^1$ is a methyl, ethyl or n-propyl group and $R^2$ is a methylene, ethylene, propylene or butylene group. Still more preferable combination is that $R^1$ is a methyl or ethyl group and $R^2$ is a methylene or ethylene group.

Hereinafter, specific examples of the particular amino acid derivatives (exemplified compounds A-1 through A-4, B-1 through B-4 and C-1 through C-4) are shown. However, the invention is not limited thereto.

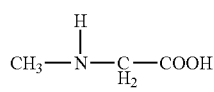
A-1

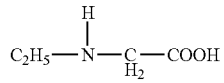
A-2

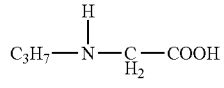
A-3

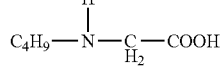
A-4

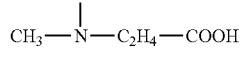
B-1

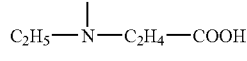
B-2

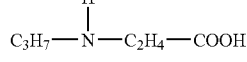
B-3

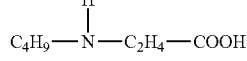
B-4

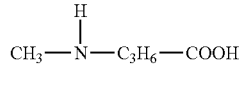
C-1

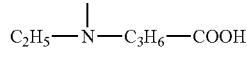
C-2

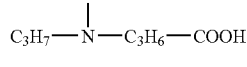
C-3

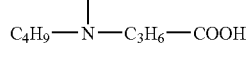
C-4

The particular amino acid derivative for the present invention is preferably at least one selected from the group consisting of N-methylglycine, N-methylalanine and N-ethylglycine to ensure a good balance between polishing speed and preventing dishing, and among these, N-methylglycine or N-ethylglycine is more preferable.

A content of the particular amino-acid derivative in the metal-polishing liquid of the invention is preferably in the range of from 0.01 to 10% by mass and more preferably in the range of from 0.05 to 5% by mass as a total amount, in the metal-polishing liquid when used in the polishing (Namely, in the case of using the metal-polishing liquid by diluting it with water or an aqueous solution, this refers to the diluted polishing liquid. Hereinafter, the "a polishing liquid when used in the polishing" has the same meaning.).

<(2) Surfactant>

The surfactant used in accordance with the present invention may be cationic, nonionic, anionic or amphoteric, but is preferably anionic or nonionic.

The anionic surfactant is preferably in the acid type, and, if it is in the salt structure, it is preferably a ammonium salt, potassium salt, sodium salt, or the like, particularly preferably a sodium salt, an ammonium salt or potassium salt. It is preferably selected from the following groups. Specific examples of anionic surfactants include carboxylic acids or salts thereof, sulfonic acids or salts thereof, sulfate ester salts, and phosphate ester salts. Carboxylic acids or salts thereof include soaps, N-acylamino acids or salts thereof, polyoxyethylene or polyoxypropylene alkyl ether carboxylic acids or salts thereof, and acylated peptides; sulfonic acids or salts thereof include alkylsulfonic acids or salts thereof, alkylbenzene or alkylnaphthalene sulfonic acids or salts thereof, naphthalene-sulfonic acids or salts thereof, sulfosuccinic acids or salts thereof, α-olefinsulfonic acids or salts thereof and N-acylsulfonic acids or salts thereof; sulfate ester salts include sulfated oil, alkylsulfuric acids or salts thereof, alkyl ether sulfuric acids or salts thereof, polyoxyethylene or polyoxypropylene alkyl-allyl ether sulfuric acids or salts thereof and alkylamide sulfuric acids or salts thereof; and phosphate ester salts include alkylphosphoric acids or salts thereof and polyoxyethylene or polyoxypropylene alkylallyl ether phosphoric acids or salts thereof. Among these, sulfonic acids or salts thereof are preferred.

The surfactant used in accordance with the present invention is preferably one having an alkyl group and/or aryl group and more preferably one represented by the formula (2) below:

$$R—Ar—O—Ar—SO_3^-M^+ \qquad \text{Formula (2)}$$

in the formula (2), R represents a straight-chain or branched alkyl group having 8 to 20 carbon atoms, Ar independently represents an aryl group, and $M^+$ represents a hydrogen ion, alkali metal ion or ammonium ion.

The alkyl group represented by R in the formula (2) has 8 to 20 carbon atoms, preferably 10 to 29 and more preferably 12 to 20 carbon atoms. The alkyl group may be of the straight-chain or branched type, and is preferably of the straight-chain type. Examples of the alkyl group represented by R include an octyl, nonyl, decyl, undecyl, dodecyl, tridecyl, tetradecyl, pentadecyl, hexadecyl, heptadecyl, octadecyl, nonadecyl or eicosyl group. Among these, a decyl, undecyl, dodecyl, tridecyl, tetradecyl, pentadecyl, hexadecyl, heptadecyl, octadecyl, nonadecyl or eicosyl group is preferable.

The aryl group represented by Ar in the formula (2) may, for example, be a phenyl, naphthyl, anthryl or phenanthryl group, and is preferably a phenyl group. Thus, the surfactant used in accordance with the present invention is preferably one having a phenyl group. More preferably, only one of the two Ar's is a phenyl group in the surfactant represented by the formula (2).

The alkyl and aryl groups in the formula (2) above may have a substituent group and examples of the substituent groups which can be introduced therein include a halogen atom (fluorine, chlorine, bromine or iodine), an alkyl group (a straight-chain, branched or cyclic alkyl group, which may be a polycyclic alkyl group such as bicycloalkyl group or may contain an active methane group), an alkenyl group, an alkynyl group, an aryl group, a heterocyclic group (which may be substituted at any position), an acyl group, an alkoxycarbonyl group, an aryloxycarbonyl group, a heterocyclic oxycarbonyl group, a carbamoyl group (examples of carbamoyl groups having substituent groups include N-hydroxycarbamoyl, N-acylcarbamoyl, N-sulfonylcarbamoyl, N-carbamoylcarbamoyl, thiocarbamoyl and N-sulfamoylcarbamoyl groups), a carbazoyl group, a carboxy group or salts thereof, an oxalyl group, an oxamoyl group, a cyano group, a carbonimidoyl group, a formyl group, a hydroxy group, an alkoxy group (including a group containing recurring ethyleneoxy or propyleneoxy units),
an aryloxy group, a heterocyclicoxy group, an acyloxy group, an (alkoxy or aryloxy)carbonyloxy group, a carbamoyloxy group, a sulfonyloxy group, an amino group, an (alkyl, aryl or heterocyclic)amino group, an acylamino group, a sulfonamide group, a ureido group, a thioureido group, an N-hydroxyureido group, an imido group, an (alkoxy or aryloxy)carbonylamino group, a sulfamoylamino group, a semicarbazide group, a thiosemicarbazide group, a hydrazine group, an ammonio group, an oxamoylamino group, an N-(alkyl or aryl)sulfonylureido group, an N-acylureido group, an N-acylsulfamoylamino group, a hydroxyamino group, a nitro group, a heterocyclic group containing a quaternary nitrogen atom (e.g. a pyridinio, imidazolio, quinolinio or isoquinolinio group), an isocyano group, an imino group, a mercapto group, an (alkyl, aryl or heterocyclic)thio group, an (alkyl, aryl or heterocyclic)dithio group, an (alkyl or aryl)sulfonyl group, an (alkyl or aryl)sulfinyl group, a sulfo group, a sulfamoyl group (examples of sulfamoyl groups having substituent groups include N-acylsulfamoyl and N-sulfonylsulfamoyl groups), a phosphino group, a phosphinyl group, a phosphinyloxy group, a phosphinylamino group and a silyl group, and an alkyl or sulfo group is preferred.

While a hydrogen ion, alkali metal ion or ammonium ion can be chosen to be the $M^+$ in general formula (2), a hydrogen ion or ammonium ion is preferable and a hydrogen ion is more preferable. Among alkali metal ions, sodium ion or potassium ion is preferable, and a sodium ion is more preferable. The ammonium ion includes an ammonium ion having its hydrogen atom replaced by an alkyl group.

Preferable examples of the surfactant represented by formula (2) above include an alkyldiphenyl ether monosulfonic acid or salts thereof or an alkyldiphenyl ether disulfonic acid or salts thereof. More preferable examples include a mixture of an alkyldiphenyl ether monosulfonic acid or salts thereof and an alkyldiphenyl ether disulfonic acid or salts thereof. In the mixture, it is preferable to be contained alkyldiphenyl ether monosulfonic acid or salts thereof 10 mol % or more, more preferably 30 mol % or more, and still more preferably 50 mol % or more.

The surfactant represented by formula (2) above may be manufactured by a method not limited in particular, and a commercially available product is preferably employed.

Cationic surfactants include aliphatic amine salts, aliphatic quaternary ammonium salts, benzalkonium chloride salt, benzethonium chloride, pyridinium salts, and imidazolinium salts; and amphoteric surfactants include carboxybetaine-type, sulfobetaine type, aminocarboxylate salts, imidazolinium betaines, lecithins, and alkylamine oxides.

Nonionic surfactants include ether-type, ether ester-type, ester-type, nitrogen-containing-type; ether-type surfactants including polyoxyethylene alkyl and alkylphenylethers, alkyl allyl formaldehyde-condensed polyoxyethylene ethers, polyoxyethylene polyoxypropylene block polymer, and polyoxyethylene polyoxypropylene alkylethers; ether ester-type surfactants including glycerin ester polyoxyethylene ether, sorbitan ester polyoxyethylene ether, and sorbitol ester polyoxyethylene ether; ester-type surfactants including polyethylene glycol fatty acid esters, glycerin esters, polyglycerin esters, sorbitan esters, propylene glycol esters, and sucrose esters; nitrogen-containing surfactants including fatty acid alkanol amides, polyoxyethylene fatty acid amides, and polyoxyethylene alkyl amides; and the like.

As the nonionic surfactant, a silicone surfactant is preferable and may be any compound having a straight chain of siloxane as its backbone and containing a polyoxyalkylene group, such as polyoxyethylene or polyoxypropylene, added thereto. Preferably a polyether-modified silicone surfactant and more preferably a polyether-modified silicone surfactant having an ether bond at a side chain or terminal. More specifically, preferred examples include a polyoxyethylene-methylpolysiloxane copolymer, a poly(oxyethylene-oxypropylene)-methylpolysiloxane copolymer, a polyoxyethylenealkylpolysiloxane-polyoxypropylenealkylpolysiloxane-dimethylpolysiloxane copolymer and a methylpolysiloane-alkylmethylpolysiloxane-poly(oxyethylene-oxypropylene)methylpolysiloxane copolymer. A polyoxyethylene-methylpolysiloxane copolymer is especially preferred.

The silicone surfactant in the metal-polishing liquid preferably has an HLB value of 8 or more. If its HLB value is less than 8, it is likely that an organic residue originating from the silicone may remain as foreign matter. Its HLB value is more preferably 8 or more and less than 20, still more preferably 9 or more and less than 20 and most preferably 10 or more and less than 16.

The surfactant employed in the metal-polishing liquid according to the present invention is preferably a polyether-modified silicone surfactant having an HLB value of 8 or more and less than 20.

A fluorine surfactant is also preferable for use in the metal-polishing liquid according to the present invention. The fluorine surfactant is a surfactant having fluorine atoms substituted for a part or all of the hydrogen ions in an ordinary anionic, nonionic, cationic or amphoteric surfactant and is known for its excellent power in lowering the surface tension. Specific examples are Unidyne Series (trade name, produced by Daikin Industries, Ltd.), Megaface Series (trade name, produced by Dainippon Ink & Chemicals, Inc.), Ftergent Series (trade name, produced by NEOS Co., Ltd.), Surflon Series (trade name, produced by Asahi Glass Co., Ltd.) and F-TOP (trade name, produced by Tohkem Products Co.).

The surfactant may be used alone or in combination of at least two kinds thereof.

The total additive amount of the surfactant which the metal-polishing liquid according to the present invention may contain is preferably from $1 \times 10^{-6}$ to 5% by mass, more preferably from $1 \times 10^{-6}$ to 3% by mass and still more preferably from $1 \times 10^{-6}$ to 2.5% by mass in the liquid which is actually at the time of polishing. The amount of the surfactant which the metal-polishing liquid according to the present invention contains is measured by HPLC using an adequate HPLC column.

The metal-polishing liquid according to the present invention preferably has a surface tension of less than 55 mN/m, more preferably less than 50 mN/m and still more preferably less than 45 mN/m.

In the present invention, the metal-polishing liquid which is adjusted to include surfactant of $3 \times 10^{-3}$% by mass preferably has a surface tension of less than 55 mN/m, still more preferably less than 50 mN/m and particularly preferably less than 45 mN/m.

It is especially preferably that the metal-polishing liquid according to the present invention contains a silicone surfactant, with the amount of the silicone surfactant adjusted to $3 \times 10^{-3}$% by mass, and has a surface tension of less than 55 mN/m, more preferably less than 50 mN/m and still more preferably less than 45 mN/m.

The surface tension of the metal-polishing liquid in which the amount of the (silicone) surfactant has been adjusted to $3\times10^{-3}$% by mass means the surface tension of a liquid in which the amount of the surfactant has been adjusted to $3\times10^{-3}$% by mass either by (1) adding the surfactant when the amount is less than $3\times10^{-3}$% by mass, or (2) diluting the liquid with water when the amount of the surfactant is over $3\times10^{-3}$% by mass. The surface tension is a value measured at 25° C. by the Wilhelmy (plate) method (using, for example, CBVP-Z, trade name, produced by Kyowa Interface Science Co., Ltd.).

<Other Constituents>

Description will now be made of other substances that the metal-polishing liquid according to the present invention may contain.

<Abrasive Grains>

While any kind of abrasive grains may be used as long as they can polish copper or a copper alloy, yet suppress the generation of scratches or other damage, preferred examples include fumed silica, colloidal silica, ceria, alumina, titania, organic and organic-inorganic composite particles, but these are not the only possibilities, and any other kind of abrasive grains can also be employed in accordance with the object or use for which they are employed. The metal-polishing liquid according to the present invention preferably contains at least one kind of abrasive grains selected from the group consisting of ceria, silica, alumina and organic-inorganic composite particles, and more preferably contains colloidal silica particles as will be described later.

The abrasive grains are generally of metal oxides, and cerium and silica grains are particularly well known, and among these abrasive grains containing silica are particularly preferably used. While spherical particles or spherical particles associated into colloidal silica or fumed silica are known as abrasive grains containing silica, colloidal silica is often preferred. A mixture of different kinds of abrasive grains can be employed and single kinds of abrasive grains or combinations of different kinds of abrasive grains may be employed, and the grains may be inorganic or organic as long as they can polish a metal.

Among the types of colloidal silica, description will now be made in detail of the colloidal silica preferred as abrasive grains, though the present invention is not limited to such abrasive grains. Colloidal silica particles in which at least part of silicon atoms on the surface thereof are modified with aluminum atoms (hereinafter referred to sometimes as "particular colloidal silica") are preferable for use as abrasive grains in the metal-polishing liquid according to the present invention than other types of colloidal silica.

In the invention, the "colloidal silica in which at least part of silicon atoms on the surface thereof are modified with aluminum atoms" means a state where aluminum atoms are present on the surface of the colloidal silica having sites including silicon atoms having a coordination number of 4. This may be a state where, on a surface of the colloidal silica, aluminum atoms to which four oxygen atoms are coordinated are bonded and aluminum atoms are fixed in a state of four coordination to form a new surface, or may be a state where silicon atoms present on the surface are first removed from the surface and then substituted by aluminum atoms to form a new surface.

The colloidal silica used in the preparation of the particular colloidal silica is more preferably colloidal silica that does not have impurities such as alkali metals inside of a particle and is obtained through hydrolysis of alkoxysilane. On the other hand, while colloidal silica that is produced according to a process where alkali is removed from an aqueous solution of alkali silicate can be used as well, in this case, there is a concern that alkali metal remaining inside of a particle is gradually eluted to adversely affect the polishing performance; accordingly, from such a viewpoint, one obtained through the hydrolysis of alkoxysilane is more preferred as a raw material. A particle diameter of colloidal silica that is to be a raw material, though appropriately selected in accordance with usage of the abrasive grains, is generally in the range of approximately from 5 to 200 nm.

As a method of modifying silicon atoms on a surface of such a colloidal silica particle with aluminum atoms to obtain the particular colloidal silica, for instance, a method where an aluminate compound such as ammonium aluminate is added to a dispersion solution of colloidal silica may be preferably used. More specifically, a method where an aluminum compound-containing alkaline silica sol prepared by a method where silica sol obtained by adding an aqueous solution of alkali aluminate is heated at a temperature in the range of 80 to 250° C. for 0.5 to 20 hr, followed by bringing it into contact with a cation exchange resin or a cation exchange resin and an anion exchange resin, a method where an acidic silicate solution and an aqueous solution of an aluminum compound are added to a $SiO_2$-containing alkali aqueous solution or an aqueous solution of alkali metal hydroxide, or a method where an acidic silicate solution in which an aluminum compound is mixed is added to a $SiO_2$-containing alkali aqueous solution or an aqueous solution of alkali metal hydroxide, is treated with a cation exchange resin to carry out dealkalization may be used. These methods are detailed in Japanese Patent No. 3463328 and JP-A No. 63-123807, and the descriptions thereof can be applied to the invention.

Furthermore, as other method, a method in which aluminum alkoxide is added to a dispersion solution of colloidal silica may be cited. Although whatever kinds of aluminum alkoxides may be used here, aluminum isopropoxide, aluminum butoxide, aluminum methoxide and aluminum ethoxide are preferable and aluminum isopropoxide and aluminum butoxide are more preferable.

The particular colloidal silica is excellent in the dispersibility even in an acidic state, because aluminosilicate sites generated via a reaction between four-coordinated aluminate ions and silanol groups on the surface of colloidal silica fix negative charges to impart a large negative zeta potential to the particle. Accordingly, it is important that the particular colloidal silica produced according to the aforementioned method is in the state that aluminum atoms are coordinated with four oxygen atoms.

It can be readily confirmed the structure that modification of silicon atoms and aluminum atoms is generated on the surface of colloidal silica by, for instance, measuring the zeta potential of abrasive grains.

A modification amount to aluminum atoms when silicon atoms on the surface of the colloidal silica are modified to aluminum atoms can be appropriately controlled by controlling an addition amount (concentration) of an aluminate compound or aluminum alkoxide added to a dispersion solution of colloidal silica.

An introduction amount of aluminum atoms to a surface of colloidal silica (number of introduced aluminum atoms/number of the sites of the surface silicon atoms) can be estimated by calculating the amount of consumed aluminum compound by subtracting the amount of unreacted aluminum compound remaining after reaction from the aluminum compound added to the dispersion solution, and assuming that the consumed aluminum compound reacted at a rate of 100%, based on the surface area calculated from a diameter of the colloidal silica, the specific gravity of the colloidal silica of 2.2, and number of silanol groups per unit surface area (5 to 8 groups/nm$^2$). In an actual measurement, the obtained particular colloidal silica per se is subjected to elemental analysis, and, under the assumption that aluminum, without existing inside of a particle, spreads thinly and uniformly over a surface, the surface area of the colloidal silica/specific gravity and the number of silanol groups per unit area are used to obtain the introduction amount.

A specific example of a producing method of the particular colloidal silica will be cited. First, a dispersion solution in which colloidal silica is dispersed in water in the range of 5 to 25% by mass is prepared. A pH adjuster is added to the dispersion solution to adjust the pH in the range of 5 to 11, followed by slowly adding 15.9 g of sodium aluminate aqueous solution having an $Al_2O_3$ concentration of 3.6% by mass and a $Na_2O/Al_2O_3$ molar ratio of 1.50 under agitation over several minutes, further followed by further agitating for 0.5 hr. Thereafter, a solvent is removed to obtain the particular colloidal silica.

Particular colloidal silica preferably has a primary particle diameter of 5 to 100 nm and more preferably 5 to 60 nm. The particular colloidal silica preferably has a primary particle diameter not smaller than 5 nm to prevent blocking of pores of a pad and achieve a satisfactorily high polishing speed, and not larger than 100 nm to reduce any abrasive damage or defect, such as scratches.

Here, the primary particle diameter of the particular colloidal silica particles in the invention means, when a particle size cumulative curve that shows the relationship between particle diameters of the colloidal silica and the cumulative frequencies obtained by integrating the number of particles having the particle diameters is obtained, a particle diameter at a point where the cumulative frequency is 50% in the particle diameter cumulative curve.

The particle diameter of the colloidal silica particles represents an average particle diameter obtained from a particle size distribution curve obtained by use of a dynamic light scattering method. For instance, as a measurement unit for obtaining a particle size distribution curve, LB-500 (trade name, produced by Horiba Limited) may be used.

In the particular colloidal silica, from the viewpoint of inhibiting polishing faults and defects such as scratches from occurring, the degree of association of the particular colloidal silica is preferably 5 or less and more preferably 3 or less.

Here, the degree of association means a value obtained by dividing a diameter of a secondary particle formed through aggregation of primary particles by a diameter of a primary particle (diameter of secondary particle/diameter of primary diameter). Such "aggregation" includes either cases in which the spherical colloidal silica is aggregated in the polishing liquid and also cases in which the colloidal silica is associated together initially. A degree of association of 1 means colloidal silica in which spherical colloidal silica is not aggregated.

As mentioned above, particular colloidal silica particles may be partially associated. Among the particular colloidal silica particles, associated secondary particles are, from the viewpoint of inhibiting the erosion and scratch from occurring, preferably 300 nm or less in the particle diameter. On the other hand, from the viewpoint of achieving a sufficient polishing speed, a lower limit value thereof is preferably 10 nm or more. Furthermore, secondary diameters of the particular colloidal silica particles are more preferably in the range of 10 to 200 nm.

The secondary particle diameter may be measured by use of an electron microscope.

Among the abrasive grains contained in the metal-polishing liquid of the invention, a mass ratio of the particular colloidal silica is preferably 10% or more and particularly preferably 20% or more. All of the contained abrasive grains may be the particular colloidal silica.

A content of the abrasive grains in the metal-polishing liquid of the invention is, from the viewpoint of diminishing the polishing faults and defects such as scratches, preferably 1% by mass or less, more preferably from 0.0001% by mass to 0.9% by mass, and still more preferably from 0.001% by mass to 0.7% by mass with respect to the total mass of the metal-polishing liquid at the point of use in the polishing.

Sizes of the abrasive grains other than the particular colloidal silica are preferably equal to or greater than that of the particular colloidal silica but no more than twice the size of the particular colloidal silica.

<Oxidizing Agent>

The metal-polishing liquid according to the invention preferably contains an oxidizing agent (compound that oxidize the metal to be polished).

Examples of the oxidizing agents include hydrogen peroxide, peroxides, nitrate salts, iodate salts, periodate salts, hypochlorite salts, chlorite salts, chlorate salts, perchlorate salts, persulfate acid salts, dichromate salts, permanganate salts, ozone water, silver (II) salts, and iron (III) salts.

Favorable examples of the iron (III) salts include inorganic iron (III) salts such as iron nitrate (III), iron chloride (III), iron sulfate (III), and iron bromide (III), and organic iron (III) complex salts.

When an organic iron (III) complex salt is used, examples of the complex-forming compounds for the iron (III) complex salt include acetic acid, citric acid, oxalic acid, salicylic acid, diethyldithiocarbaminc acid, succinic acid, tartaric acid, glycolic acid, glycine, alanine, aspartic acid, thioglycol acid, ethylenediamine, trimethylenediamine, diethylene glycol, triethylene glycol, 1,2-ethanedithiol, malonic acid, glutaric acid, 3-hydroxybutyric acid, propionic acid, phthalic acid, isophthalic acid, 3-hydroxysalicylic acid, 3,5-dihydroxysalicylic acid, gallic acid, benzoic acid, maleic acid, the salts thereof, and aminopolycarboxylic acids and the salts thereof.

Examples of the amino polycarboxylic acid and the salts thereof include ethylenediamine-N,N,N',N'-tetraacetic acid, diethylenetriaminepentaacetic acid, 1,3-diaminopropane-N, N,N',N'-tetraacetic acid, 1,2-diaminopropane-N,N,N',N'-tetraacetic acid, ethylenediamine-N,N'-disuccinic acid (racemic body), ethylenediaminedisuccinic acid (SS isomer), N-(2-carboxylatoethyl)-L-aspartic acid, N-(carboxymethyl)-L-aspartic acid, β-alaninediacetic acid, methyliminodiacetic acid, nitrilotriacetic acid, cyclohexanediaminetetraacetic acid, iminodiacetic acid, glycol ether diamine-tetraacetic acid, ethylenediamine-1-N,N'-diacetic acid, ethylenediamine-orthohydroxyphenylacetic acid, N,N-bis(2-hydroxybenzyl)ethylenediamine-N,N-diacetic acid, and the like, and the salts thereof. The counter salt is preferably an alkali-metal salt or an ammonium salt, particularly preferably an ammonium salt.

In particular, hydrogen peroxide, iodate salts, hypochlorite salts, chlorate salts, persulfate salts, and organic iron (III) complex salts are preferable; when an organic iron (III) organic complex salt is used, favorable complex-forming compounds include citric acid, tartaric acid, aminopolycarboxylic acid (specifically, ethylenediamine-N,N,N',N'-tetraacetic acid, diethylenetriamine pentaacetic acid, 1,3-diaminopropane-N,N,N',N'-tetraacetic acid, ethylenediamine-N, N'-disuccinic acid (racemic body), ethylenediamine disuccinic acid (SS isomer), N-(2-carboxylatoethyl)-L-aspartic acid, N-(carboxymethyl)-L-aspartic acid, β-alanine diacetic acid, methyliminodiacetic acid, nitrilotriacetic acid, and iminodiacetic acid).

Among the oxidizing agents above, hydrogen peroxide, persulfate salts, and iron (III) ethylenediamine-N,N,N',N'-tetraacetate, and the complexes of 1,3-diaminopropane-N,N,N',N'-tetraacetic acid and ethylenediaminedisuccinic acid (SS isomer) are most favorable.

The additive amount of the oxidizing agent is preferably 0.003 mol to 8 mol, more preferably 0.03 mol to 6 mol, and particularly more preferably 0.1 mol to 4 mol, per L of the metal-polishing liquid at the time of polishing. The additive amount of the oxidizing agent is preferably 0.003 mol or more for assuring a CMP rate oxidizing the metal sufficiently and 8 mol or less for prevention of roughening of the polishing face.

The oxidizing agent is preferably used by mixing to a composition containing other components than the oxidizing agent when a polishing liquid is used to polish.

<pH of Metal-Polishing Liquid>

The pH of the metal-polishing liquid of the invention is preferably in the range of 4 to 11, more preferably in the range of 5 to 8 and further more preferably in the range of 6 to 8. In the range of 4 to 11, the metal-polishing liquid of the invention exerts particularly excellent advantages. The polishing liquid of the invention, at the time of the polishing, may not contain water or may be diluted with water or an aqueous solution. When the polishing liquid is diluted with water or an aqueous solution, the pH in the invention denotes a value after dilution with water or an aqueous solution.

The pH of the metal-polishing liquid of the invention may be set considering the absorptivity to and the reactivity with a surface to be polished of the amino acid derivative, the solubility of the metal to be polished, the electrochemical property of a surface to be polished, a dissociation state of compound functional groups and the stability as a liquid.

The pH of the metal-polishing liquid may be adjusted by adding, for instance, an alkali agent or other organic acids, which are described below. The alkali agent and other organic acids will be detailed below.

-Aromatic Heterocyclic Compound-

The metal-polishing liquid of the invention preferably contains at least one kind of aromatic heterocyclic compound, as a compound that forms a passivation film on a surface of a metal to be polished.

Here, the "aromatic heterocyclic compound" is a compound having a heterocycle containing at least one hetero atom. The "hetero atom" means an atom other than a carbon atom and a hydrogen atom. The heterocycle means a ring compound having at least one hetero atom. The hetero atom means only an atom that constitutes a constituent portion of a ring system of the heterocycle but not an atom located outside of the ring system, nor an atom separated from the ring system via at least one non-conjugate single bond, and nor an atom that is a part of a further substituent of the ring system.

Preferable examples of the hetero atoms include a nitrogen atom, a sulfur atom, an oxygen atom, a selenium atom, a tellurium atom, a phosphorus atom, a silicon atom and a boron atom. More preferable examples thereof include a nitrogen atom, a sulfur atom, an oxygen atom and a selenium atom. Particularly preferable examples thereof include a nitrogen atom, a sulfur atom and an oxygen atom. Most preferable examples thereof include a nitrogen atom and a sulfur atom.

In the beginning, an aromatic heterocycle that is a mother nucleus will be described.

The aromatic heterocyclic compound that is used in the invention, without particularly limiting the number of rings of a heterocycle, may be a monocyclic compound and a polycyclic compound having a condensed ring. The number of members in the case of a monocycle is preferably 3 to 8, more preferably 5 to 7 and particularly preferably 5 and 6. Furthermore, the number of rings in the case of having a condensed ring is preferably in the range of 2 to 4 and more preferably 2 or 3.

Specific examples of the aromatic heterocycles are not particularly limited thereto, but include a pyrrole ring, a thiophene ring, a furan ring, a pyrane ring, a thiopyrane ring, an imidazole ring, a pyrazole ring, a thiazole ring, an isothiazole ring, an oxazole ring, an isoxazole ring, a pyridine ring, a pyradine ring, a pyrimidine ring, a pyridazine ring, a pyrrolidine ring, a pyrazolidine ring, an imidazolidine ring, an isoxazolidine ring, an isothiazolidine ring, a piperidine ring, a piperadine ring, a morpholine ring, a thiomorpholine ring, a chroman ring, a thiochroman ring, an isochroman ring, an isothiochroman ring, an indoline ring, an isoindoline ring, a pilindine ring, an indolizine ring, an indole ring, an indazole ring, a purine ring, a quinolizine ring, an isoquinoline ring, a quinoline ring, a naphthylidine ring, a phthalazine ring, a quinoxaline ring, a quinazoline ring, a cinnoline ring, a pteridine ring, an acridine ring, a piperidine ring, a phenanthroline ring, a carbazole ring, a carboline ring, a phenazine ring, an antilysine ring, a thiadiazole ring, an oxadiazole ring, a triazine ring, a triazole ring, a tetrazole ring, a benzoimidazole ring, a benzoxazole ring, a benzothiazole ring, a benzothiadiazole ring, a benzofuroxan ring, a naphthoimidazole ring, a benzotriazole ring and a tetraazaindene ring, and more preferably include a triazole ring and a tetrazole ring.

Next, substituents, that the aromatic heterocyclic ring may have, will be described.

In the present invention, when a particular portion is referred to as a "group", the portion itself may not be substituted but may be substituted by at least one kind (up to a possible maximum number) of substituent groups. For instance, an "alkyl group" means a substituted or non-substituted alkyl group.

The substituent groups that an aromatic heterocyclic compound may have include, for example, the following ones, without restricting thereto.

Examples thereof include halogen atoms (fluorine atom, chlorine atom, bromine atom, or iodine atom), alkyl groups (linear-chain, branched, or cyclic alkyl groups, which may be polycyclic alkyl groups like a bicycloalkyl group, or may include an active methine group), alkenyl groups, alkynyl groups, aryl groups, heterocyclic groups (substituted position is not limited), acyl groups, alkoxycarbonyl groups, aryloxycarbonyl groups, heterocyclic oxycarbonyl groups, carbamoyl groups (carbamoyl groups having a substituent include, for example, N-hydroxycarbamoyl group, N-acylcarbamoyl group, N-sulfonylcarbamoyl group, N-carbamoylcarbamoyl group, thiocarbamoyl group, and N-sulfamoylcarbamoyl group), carbazoyl groups, carboxyl groups or salts thereof, oxalyl groups, oxamoyl groups, cyano groups, carboneimidoyl groups, formyl groups, hydroxy groups, alkoxy groups (including groups repeatedly containing an ethyleneoxy group or propyleneoxy group unit), aryloxy groups, heterocycloxy groups, acyloxy groups, (alkoxy or aryloxy)carbonyloxy groups, carbamoyloxy groups, sulfonyloxy groups, amino groups, (alkyl, aryl, or heterocyclic)amino groups, acylamino groups, sulfonamide groups, ureido groups, thioureido groups, N-hydroxyureido groups, imido groups, (alkoxy or aryloxy)carbonylamino groups, sulfamoylamino groups, semicarbazide groups, thiosemicarbazide groups, hydrazino groups, ammonio groups, oxamoylamino groups, N-(alkyl or aryl)sulfonylureido groups, N-acylureido groups, N-acylsulfamoylamino groups, hydroxyamino groups, nitro groups, heterocyclic groups containing a quaternized nitrogen atom (such as a pyridinio group, imidazolio group, quinolinio group, isoquinolinio group), isocyano groups, imino groups, mercapto groups, (alkyl, aryl, or heterocyclic)thio groups, (alkyl, aryl, or heterocyclic)dithio groups, (alkyl or aryl)sulfonyl groups, (alkyl or aryl)sulfinyl groups, sulfo groups or salts thereof, sulfamoyl groups (sulfamoyl groups having a substituent include, for example, an N-acylsulfamoyl group and N-sulfonylsulfamoyl group) or salts thereof, phosphino groups, phosphinyl groups, phosphinyloxy groups, phosphinylamino groups, and silyl groups.

Now, the "active methine group" means a methine group substituted by two electron drawing groups. The "electron drawing group" means, for instance, an acyl group, an alkoxycarbonyl group, an aryloxycarbonyl group, a carbamoyl group, an alkylsulfonyl group, an arylsulfonyl group, a sulfamoyl group, a trifluoromethyl group, a cyano group, a nitro group and a carbonimidoyl group. Furthermore, two electron drawing groups may combine each other to form a ring structure. Still furthermore, the "salt" means a positive ion of an alkali metal, an alkaline earth metal or a heavy metal or an organic positive ion such as ammonium ion or a phosphonium ion.

Among them, examples of preferable substituents in aromatic heterocyclic compounds include halogen atoms (a fluorine atom, chlorine atom, bromine atom, or iodine atom), alkyl groups (linear-chain, branched, or cyclic alkyl groups, which may be polycyclic alkyl groups such as a bicycloalkyl group, or may include an active methine group), alkenyl groups, alkynyl groups, aryl groups, heterocyclic groups (substituted position is not limited), acyl groups, alkoxycarbonyl groups, aryloxycarbonyl groups, heterocyclic oxycarbonyl groups, carbamoyl groups, N-hydroxycarbamoyl groups, N-acylcarbamoyl groups, N-sulfonylcarbamoyl groups, N-carbamoylcarbamoyl groups, thiocarbamoyl groups, N-sulfamoylcarbamoyl groups, carbazoyl groups, oxalyl groups, oxamoyl groups, cyano groups, carboneimidoyl groups, formyl groups, hydroxy groups, alkoxy groups (include groups repeatedly containing an ethyleneoxy group or propyleneoxy group unit), aryloxy groups, heterocycloxy groups, acyloxy groups, (alkoxy or aryloxy)carbonyloxy groups, carbamoyloxy groups, sulfonyloxy groups, (alkyl, aryl, or heterocyclic)amino groups, acylamino groups, sulfoneamide groups, ureido groups, thioureido groups, N-hydroxyureido groups, imido groups, (alkoxy or aryloxy)carbonylamino groups, sulfamoylamino groups, semicarbazide groups, thiosemicarbazide groups, hydrazino groups, ammonio groups, oxamoylamino groups, N-(alkyl or aryl)sulfonylureido groups, N-acylureido groups, N-acylsulfamoylamino groups, hydroxyamino groups, nitro groups, heterocyclic groups containing a quaternized nitrogen atom (such as a pyridinio group, imidazolio group, quinolinio group, isoquinolinio group), isocyano groups, imino groups, mercapto groups, (alkyl, aryl, or heterocyclic)thio groups, (alkyl, aryl, or heterocyclic)dithio groups, (alkyl or aryl)sulfonyl groups, (alkyl or aryl)sulfinyl groups, sulfo groups or salts thereof, sulfamoyl groups, N-acylsulfamoyl groups, N-sulfonylsulfamoyl groups or salts thereof, phosphino groups, phosphinyl groups, phosphinyloxy groups, phosphinylamino groups or silyl groups.

Now, the active methine group means a methine group substituted by two electron drawing groups, and the electron drawing group means, for instance, an acyl group, an alkoxycarbonyl group, an aryloxycarbonyl group, a carbamoyl group, an alkylsulfonyl group, an arylsulfonyl group, a sulfamoyl group, a trifluoromethyl group, a cyano group, a nitro group and a carbonimidoyl group.

Further, preferable examples thereof include halogen atoms (a fluorine atom, chlorine atom, bromine atom, or iodine atom), alkyl groups (linear-chain, branched, or cyclic alkyl groups, which may be polycyclic alkyl groups such as a bicycloalkyl group, or may include an active methine group), alkenyl groups, alkynyl groups, aryl groups and heterocyclic groups (substituted position is not limited).

Two of the above-mentioned substituents may combine with each other to form a ring (aromatic or non-aromatic hydrocarbon ring or aromatic heterocyclic ring), which may further combine to form a polycyclic condensed ring. Examples thereof include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring and a phenazine ring.

The aromatic heterocyclic compound preferably contains three or more nitrogen atoms and is preferably at least one compound selected from the group consisting of triazole and derivatives thereof, tetrazole and derivatives thereof and benzotriazole and derivatives thereof. Specific examples of the aromatic heterocyclic compounds include 1,2,3,4-tetrazole, 5-amino-1,2,3,4-tetrazole, 5-methyl-1,2,3,4-tetrazole, 1H-tetrazole-5-acetic acid, 1H-tetrazole-5-succinic acid, 1,2,3-triazole, 4-amino-1,2,3-triazole, 4,5-diamino-1,2,3-triazole, 4-carboxy-1H-1,2,3-triazole, 4,5-dicarboxy-1H-1,2,3-triazole, 1H-1,2,3-triazole-4-acetic acid, 4-carboxy-5-carboxymethyl-1H-1,2,3-triazole, 1,2,4-triazole, 3-amino-1,2,4-triazole, 3,5-diamino-1,2-4-triazole, 3-carboxy-1,2-4-triazole, 3,5-dicarboxy-1,2,4-triazole, 1,2,4-triazole-3-acetic acid, 1H-benzotriazole and 1H-benzotriazole-5-carboxylic acid, though it is not limited to these.

Typical examples of the preferable examples of (a) 1,2,3,4-tetrazole, (b) 1,2,3-triazole and (c) 1,2,4-triazole that are cited as aromatic heterocyclic compounds preferably used in the invention are set forth below.

(a) As preferable 1,2,3,4-tetrazole derivatives, ones that do not have a substituent on a nitrogen atom that forms a ring and have a particular substituent at the 5 position can be cited.

(b) As preferable 1,2,3-triazole derivatives, ones that do not have a substituent on a nitrogen atom that forms a ring and have a particular substituent on 4 and/or 5 position can be cited.

(c) As preferable 1,2,4-triazole derivatives, ones that do not have a substituent on a nitrogen atom that forms a ring and have a particular substituent on 2 and/or 5 position can be cited.

(a) Examples of substituent groups that 1,2,3,4-tetrazole has at the 5 position include a substituent group selected from a sulfo group, an amino group, a carbamoyl group, a carbonamide group, a sulfamoyl group and a sulfone amide group, and an alkyl group substituted by at least one substituent selected from a hydroxy group, a carboxyl group, a sulfo group, an amino group, a carbamoyl group, a carbon amide group, a sulfamoyl group and a sulfone amide group. More preferable are alkyl groups substituted by at least one substituent selected from a hydroxy group, a carboxyl group, a sulfo group, an amino group and a carbamoyl group. The alkyl group may have other substituents, as long as it has at least one of the above-listed substituents.

More preferable examples of the (a) 1,2,3,4-tetrazole derivatives having a substituent at the 5 position include tetrazole derivatives containing an alkyl group substituted by at least one of a hydroxy group or a carboxyl group as a substituent. Still more preferable examples include tetrazole derivatives that contain an alkyl group substituted by at least one carboxyl group as a substituent. Examples of such 1,2,3,4-tetrazole derivatives include 1H-tetrazole-5 acetic acid and 1H-tetrazole-5-succinic acid.

Examples of substituents that 1,2,3-trizole may have at the 4 and/or 5 position include a substituent selected from a hydroxy group, a carboxyl group, a sulfo group, an amino group, a carbamoyl group, a carbonamide group, a sulfamoyl group and a sulfone amide group or an alkyl group or an aryl group substituted by at least one substituent selected from a hydroxy group, a carboxyl group, a sulfo group, an amino group, a carbamoyl group, a carbon amide group, a sulfamoyl group and a sulfone amide group. More preferable are substituents selected from a hydroxy group, a carboxyl group, a sulfo group and an amino group or an alkyl group substituted by at least one substituent selected from a hydroxy group, a carboxyl group, a sulfo group and an amino group. The alkyl group and aryl group, may have other substituents, as long as they have at least one of the above-listed substituents. Furthermore, one obtained by substituting either one of the 4 and 5 positions of 1,2,3-triazole is preferred.

Preferable examples of (b) 1,2,3-triazole derivatives having a substituent at the 4 and/or 5 position include 1,2,3-triazole derivatives containing a substituent selected from a hydroxy group and a carboxyl group, and an alkyl group substituted by at least either of a hydroxy group or a carboxy group. Still more preferable examples include 1,2,3-triazole derivatives that include a carboxyl group or an alkyl group substituted by at least one carboxyl group as a substituent. Examples of such 1,2,3-triazole derivatives include 4-carboxy-1H-1,2,3-triazole, 4,5-dicarboxy-1H-1,2,3-triazole, 1H-1,2,3-triazole-4-acetic acid and 4-carboxy-5-carboxymethyl-1H-1,2,3-triazole.

(c) Examples of substituents that 1,2,4-triazole may have at the 3 and/or 5 position include a substituent selected from a sulfo group, a carbamoyl group, a carbonamide group, a sulfamoyl group and a sulfone amide group, and an alkyl group or aryl group substituted by at least one substituent selected from a hydroxy group, a carboxyl group, a sulfo group, an amino group, a carbamoyl group, a carbon amide group, a sulfamoyl group and a sulfone amide group. More preferable are alkyl groups substituted by at least one substituent selected from a hydroxy group, a carboxyl group, a sulfo group and an amino group. The alkyl group and aryl group may have other substituents as long as they have at least one of the above-listed substituents. Furthermore, one obtained by substituting either one of the 3 and 5 positions of (c) 1,2,4-triazole is preferred.

Preferable examples of the (c) 1,2,4-triazole derivatives having a substituent at 3 and/or 5 position include 1,2,4-triazole derivatives containing an alkyl group substituted by at least one of a hydroxy group and a carboxyl group as a substituent. More preferable examples include 1,2,4-triazole derivatives that include at least an alkyl group substituted by at least one carboxyl group as a substituent. Examples of such 1,2,4-triazole derivatives include 3-carboxy-1,2,4-triazole, 3,5-dicarboxy-1,2,4-triazole and 1,2,4-triazole-3-acetic acid.

Exemplary compounds (a-1) to (a-26) are shown below as specific examples of (a) 1,2,3,4-tetrazole derivatives, exemplary compounds (b-1) to (b-26) as specific examples of (b) 1,3,4-triazole derivatives, and exemplary compounds (c-1) to (c-19) are shown below as specific examples of (c) 1,2,4-triazole derivatives, though the present invention is not limited to these compounds.

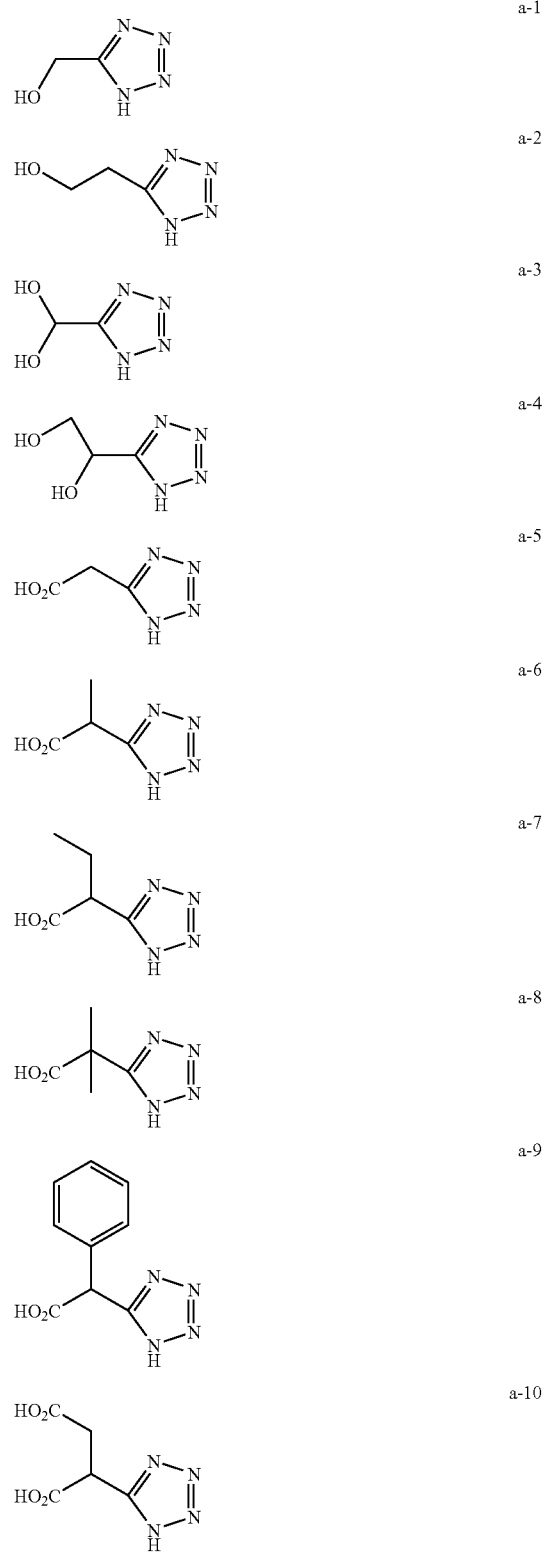

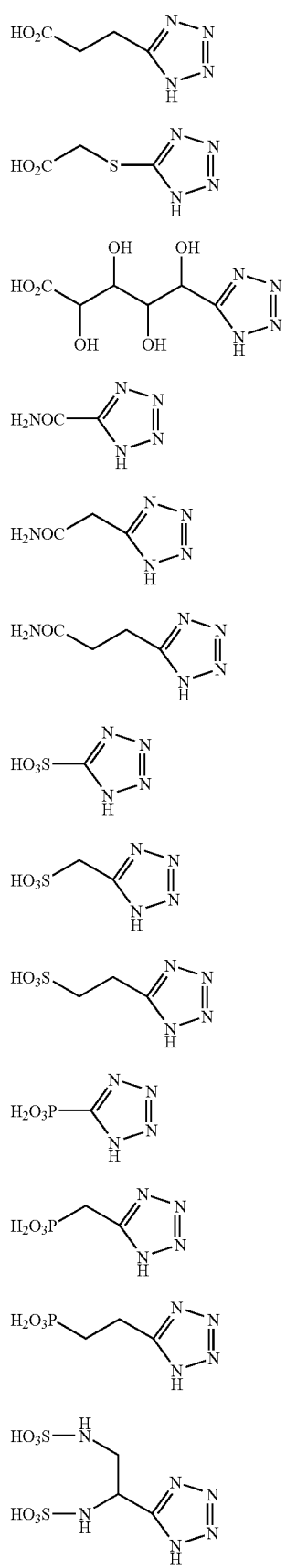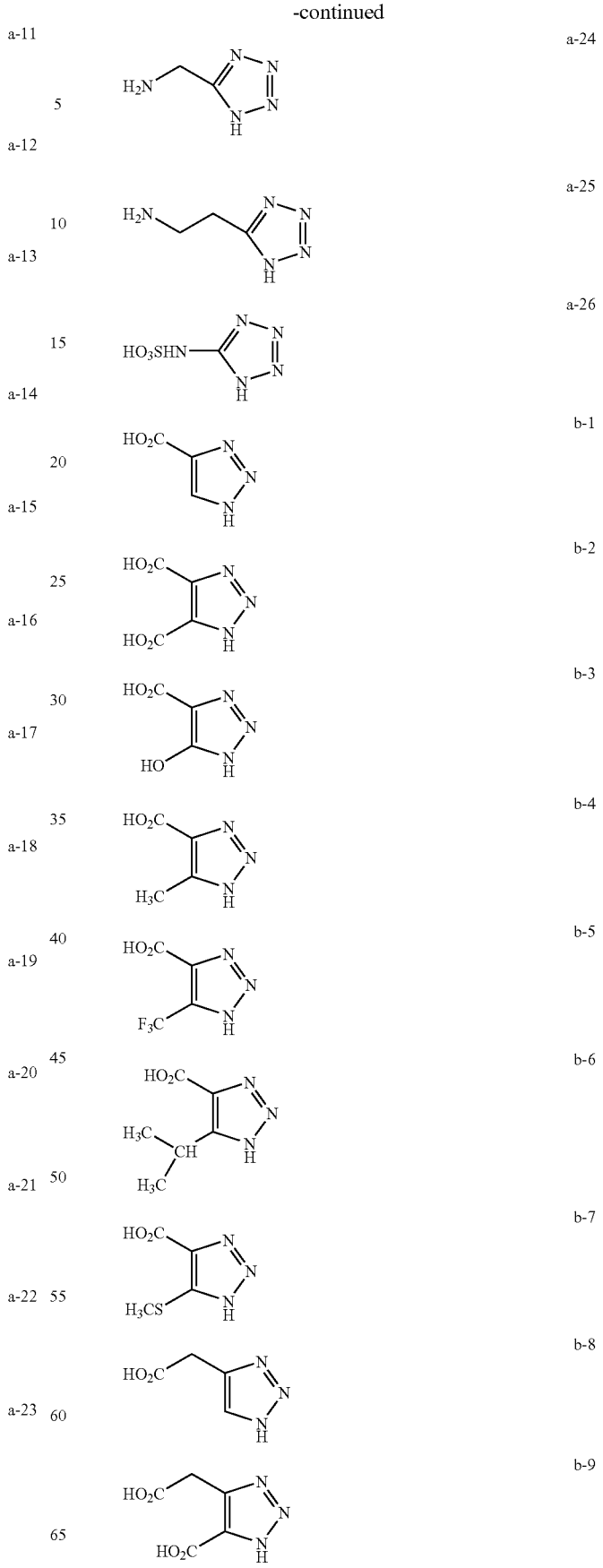

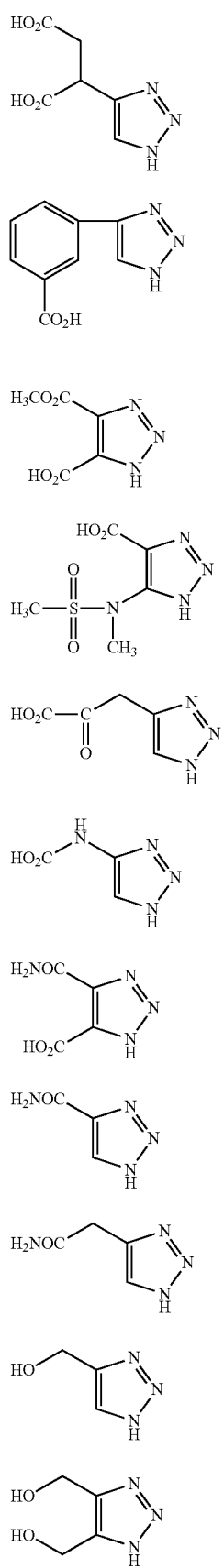
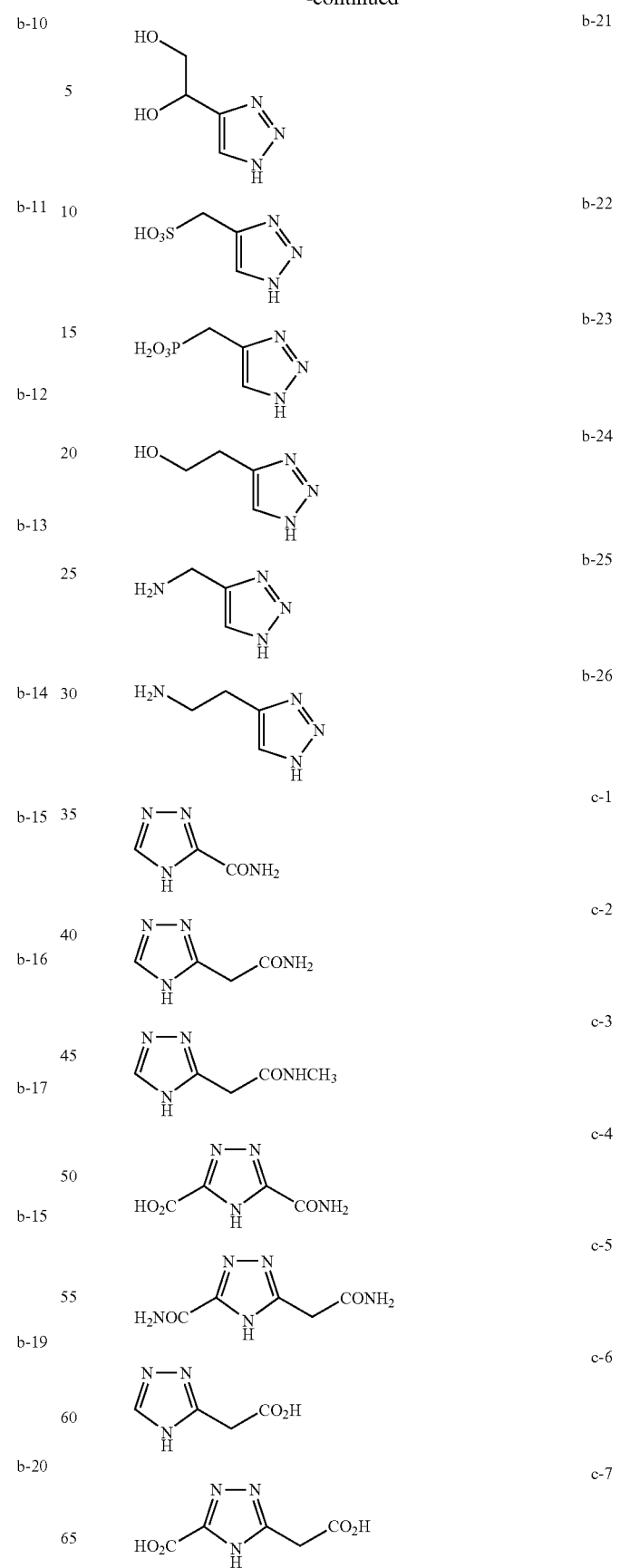

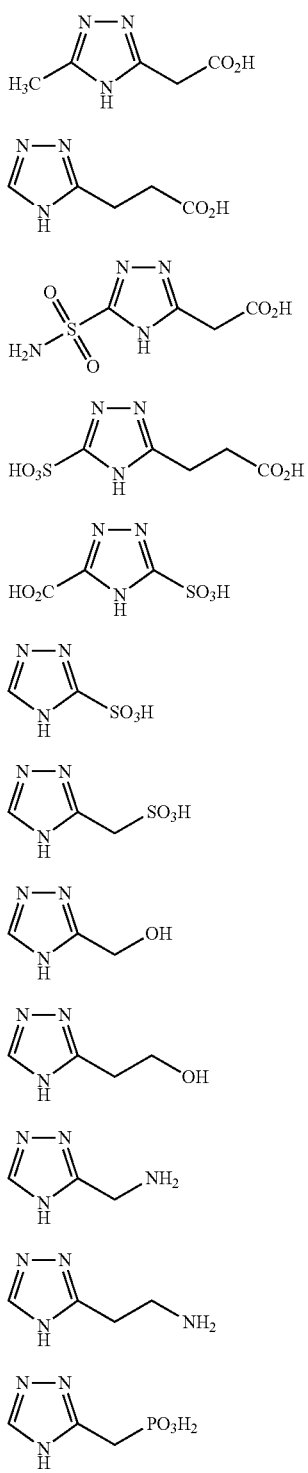

Aromatic heterocyclic compounds may be used alone or in combination of at least two kinds thereof. Furthermore, the aromatic heterocyclic compounds may be synthesized according to a standard method and commercially available products may be used.

The metal-polishing liquid of the invention particularly preferably contains tetrazole or a derivative thereof, among the above described aromatic heterocyclic compounds, from the viewpoint of being excellent in the suppressibility to the chemical dissolution of the metal wiring.

A content of the aromatic heterocyclic compound in the metal-polishing liquid of the invention is preferably in the range of 0.0001 to 1.0 mol, more preferably in the range of 0.0005 to 0.5 mol and still more preferably in the range of 0.0005 to 0.05 mo, as a total amount, in 1 L of the metal-polishing liquid at the time of polishing (that is, when it is diluted with water or an aqueous solution, diluted metal-polishing liquid).

-Polyvalent Metal Ion-

The metal-polishing liquid according to the present invention preferably has a (total) polyvalent metal ion concentration of less than 1 ppm and more preferably less than 0.3 ppm. Examples of the polyvalent metals include iron, cobalt, nickel, copper, manganese, chromium, vanadium and titanium.

The metal-polishing liquid according to the present invention preferably has, among others, an iron ion concentration of less than 1 ppm and more preferably less than 0.3 ppm.

The polyvalent metal (or iron) ion concentration can be determined by e.g. ICP-MS.

-Chelating Agent-

In the metal-polishing liquid of the invention, in order to reduce an adverse effect of mingling polyvalent metal ions, as needed, a chelating agent (that is, a water softener) is preferably contained.

Such a chelating agent may be general-purpose water softeners serving as a precipitation inhibitor of calcium or magnesium or analogous compounds thereof, and specific examples thereof include nitrilotriacetic acid, diethylene-triamine-pentaacetic acid, ethylenediamine-tetraacetic acid, N,N,N-trimethylene-phosphonic acid, ethylenediamine-N,N,N',N'-tetramethylene-sulfonic acid, trans-cyclohexane-diamine-tetraacetic acid, 1,2-diamino-propane-tetraacetic acid, glycol ether diamine-tetraacetic acid, ethylenediamine-o-hydroxy-phenyl acetic acid, ethylenediamine disuccinic acid (SS isomer), N-(2-carboxylate ethyl)-L-aspartic acid, β-alanine diacetic acid, 2-phosphonobutane-1,2,4-tricarboxylic acid, 1-hydroxy-ethylidene-1,1-diphosphonic acid, N,N'-bis(2-hydroxybenzyl)ethylenediamine-N,N'-diacetic acid and 1,2-dihydroxybenzene-4,6-disulfonic acid.

The chelating agents may be used alone or, as needed, in a combination of at least two of them.

An addition amount of the chelating agent may be an amount sufficient for sequestering metal ions such as contaminated polyvalent metal ions; accordingly, the chelating agent is added so as to be in the range of 0.003 to 0.07 mol in 1 L of the metal polishing liquid at the time of the polishing.

-Hydrophilic Polymer, Hydrophilic Compound-

The metal-polishing liquid according to the present invention preferably contains a hydrophilic polymer or compound. The hydrophilic polymer has an action of reducing the angle of contact with the surface to be polished and thereby promotes uniform polishing.

Examples of the hydrophilic polymers and compounds include esters such as glycerin ester, sorbitan ester, methoxyacetic acid, ethoxyacetic acid, 3-ethoxypropionic acid and aranine ethyl ester; ethers such as polyethylene glycol, polypropylene glycol, polytetramethylene glycol, polyethylene glycol alkyl ether, polyethylene glycol alkenyl ether, alkylpolyethylene glycol, alkylpolyethylene glycol alkyl ether, alkyl polyethylene glycol alkenyl ether, alkenyl polyethylene glycol, alkenyl polyethylene glycol alkyl ether, alkenyl polyethylene glycol alkenyl ether, polypropylene glycol alkyl ether, polypropylene glycol alkenyl ether, alkylpolypropylene glycol, alkyl polypropylene glycol alkyl ether, alkyl polypropylene glycol alkenyl ether, alkenylpolypropylene glycol, alkenyl polypropylene glycol alkyl ether and alkenyl polypropylene glycol alkenyl ether; polysaccharides such as alginic acid, pectinic acid, carboxy-methyl cellulose, curdlan and pullulan; amino acid salts such as ammonium or sodium salts of glycine; polycarboxylic acids and salts thereof, such as polyasparaginic acid, polyglutamic acid, polylycine, polymalic acid, polymethacrylic acid, ammonium salt of polymethacrylic acid, sodium salt of poly-methacrylic acid, polyamide acid, polymaleic acid, polyitaconic acid, polyfumaric acid, poly(p-styrenecarboxylic acid), polyacrylic acid, polyacrylamide, aminopolyacrylamide, ammonium polyacrylate, sodium polyacrylate, polyamide acid, ammonium salt of polyamide acid, sodium salt of polyamide acid and polyglyoxylic acid; vinyl polymers such as polyvinyl alcohol, polyvinyl pyrrolidone and polyacrolein; sulfonic acids and salts thereof, such as ammonium methyltaurinate, sodium methyltaurinate, methyl sodium sulfate, ethyl ammonium sulfate, butyl ammonium sulfate, sodium vinylsulfonate, sodium 1-allylsulfonate, sodium 2-allylsulfonate, sodium methoxymethylsulfonate, ammonium ethoxymethylsulfonate, sodium 3-ethoxypropylsulfonate, and sodium sulfosuccinate; and amides such as propionamide, acrylamide, methylurea, nicotinamide, succinic acid amide and sulfanylamide.

However, when the base substance to be processed is for example a silicon substrate for semiconductor integrated circuit, contamination with an alkali metal, alkali-earth metal, or halide is undesirable, thus, the foregoing additives are desirably acids and ammonium salts thereof. The surfactant is arbitrary, if the base substance is for example glass. Among the exemplary compounds above, ammonium salt of polyacrylic acid, polyvinyl alcohol, succinic acid amide, polyvinyl pyrrolidone, polyethylene glycol, polyoxyethylene polyoxy-propylene block copolymer are more preferable.

The total amount of the hydrophilic polymer or compound which the metal-polishing liquid may contain is preferably from $1 \times 10^{-6}$ to 10 g, more preferably from $1 \times 10^{-6}$ to 5 g and still more preferably from 0.1 to 3 g per liter of the liquid at the time of polishing. The amount of the hydrophilic polymer is preferably not less than $1 \times 10^{-6}$ g to produce a satisfactory result and not more than 10 g to prevent a reduction of the CMP speed.

The hydrophilic polymer preferably has a weight-average molecular weight of from 500 to 100,000 and more preferably from 2,000 to 50,000.

The hydrophilic polymer or compound may be used alone or in combination of at least two kinds thereof or different kinds of activating agents may be used together with the hydrophilic polymer or compound.

-Alkali Agent, Buffering Agent, and Other Organic Acids-

The metal-polishing liquid of the present invention may, in accordance with objects, within a range that does not impair the effects of the invention, contain an alkali agent, a buffering agent and other organic acid. Hereinafter, the alkali agents, buffering agents and other organic acids, which may be used in the invention will be described.

(Alkali Agent, Buffering Agent)

Furthermore, the metal-polishing liquid of the invention, as needed, may contain an alkali agent for adjusting the pH and a buffering agent from the viewpoint of inhibiting the pH from fluctuating.

Examples of such alkaline agents and buffering agents include non-metallic alkali agents such as organic ammonium hydroxide such as ammonium hydroxide and tetramethyl-ammonium hydroxide, and alkanol-amines such as diethanolamine, triethanolamine and tri-isopropanol-amine; alkali metal hydroxides such as sodium hydroxide, potassium hydroxide, and lithium hydroxide; carbonates, phosphates, borates, tetraborates, hydroxy-benzoate, glycylates, N,N-dimethyl glycylates, leucine salts, norleucine salts, guanine salts, 3,4-dihydroxy-phenylalanine salts, alanine salts, aminobutyrate, 2-amino-2-methyl-1,3-propanediol salts, valine salts, proline salts, tris(hydroxy)amino-methane salts and lysine salts.

Specific examples of such alkaline agents and buffering agents include sodium hydroxide, potassium hydroxide, lithium hydroxide, sodium carbonate, potassium carbonate, sodium bicarbonate, potassium bicarbonate, tri-sodium phosphate, tri-potassium phosphate, di-sodium phosphate, di-potassium phosphate, sodium borate, potassium borate, sodium tetraborate (borax), potassium tetraborate, sodium o-hydroxy-benzoate (sodium salicylate), potassium o-hydroxy-benzoate, sodium 5-sulfo-2-hydroxy-benzoate (sodium 5-sulfosalicylate), potassium 5-sulfo-2-hydroxy-benzoate (potassium 5-sulfosalicylate), and ammonium hydroxide.

Particularly preferable examples of the alkaline agents include ammonium hydroxide, potassium hydroxide, lithium hydroxide and tetramethyl-ammonium hydroxide.

Addition amounts of the alkaline agents and buffering agents are not particularly limited as long as pH may be maintained in a preferable range, and this is preferably in the range of 0.0001 to 1.0 mol and more preferably in the range of 0.003 to 0.5 mol with respect to 1 L of the polishing liquid used at the time of polishing.

In the invention, from the viewpoints of the fluidity of the liquid and the stability of the polishing performance, the specific gravity of the metal-polishing liquid is set preferably in the range of 0.8 to 1.5 and more preferably in the range of 0.95 to 1.35.

(Other Organic Acid)

Furthermore, the metal-polishing liquid of the invention, as needed, may contain other organic acid to adjust the pH. The "other organic acid" here is a compound different in structure from that of the particular amino acid derivative and the oxidizing agent according to the invention and does not include acids that work as the oxidizing agent.

As other organic acids, ones selected from a group below is preferable.

That is, examples thereof include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, salts such as ammonium salts or alkali metal salts of these acids, sulfuric acid, nitric acid, ammonia or ammonium salts, or mixtures thereof.

An addition amount of other organic acid may be set in the range of 0.00005 to 0.0005 mol in 1 L of the metal-polishing liquid used at the time of polishing.

The metal-polishing liquid according to the present invention preferably contains an acid agent to realize an appropriate pH value. An inorganic acid, such as sulfuric, nitric, boric or phosphoric acid, may be used as the acid agent. Sulfuric acid is, among others, preferred. The preferred amount of the acid agent which the liquid may contain is equal to that of the alkali or buffer agent as stated above.

<Polishing Method>

The polishing method according to the present invention chemically and mechanically polishes a substrate which has a conductor film of copper or a copper alloy, by using the metal-polishing liquid of the present invention as already described, in a process for manufacturing a semiconductor device.

Preferably, the surface to be polished is polished by rotating a polishing platen or otherwise to move a polishing pad attached to the polishing platen and the surface to be polished relative to each other, while supplying the metal-polishing liquid of the present invention to the polishing pad.

The chemical-mechanical polishing method as mentioned will now be described in detail.

(Polishing Apparatus)

Description will first be made of an apparatus which can be used to carry out the polishing method according to the present invention.

The polishing apparatus which is applicable to the present invention is an ordinary polishing apparatus which includes a holder for holding a material to be polished which has a surface to be polished (e.g. a semiconductor substrate) and a polishing platen having a polishing pad attached thereto (equipped with a motor having a variable rotating speed). A specific example is a FREX300 (trade name, produced by Ebara Seisakusho).

(Polishing Pressure)

The polishing method according to the present invention preferably employs a polishing pressure of from 3,000 to 25,000 Pa and more preferably from 6,500 to 14,000 Pa, the polishing pressure being the pressure of contact between the surface to be polished and the polishing pad.

(Rotational Frequency of the Polishing Platen)

The polishing method according to the present invention preferably employs a rotational frequency of from 50 to 200 rpm and more preferably from 60 to 150 rpm for the polishing platen.

(Method of Supplying the Polishing Liquid)

According to the present invention, the metal-polishing liquid is supplied to the polishing pad on the polishing platen continuously by a pump, etc. throughout the polishing of the metal to be polished. While the amount of the liquid to be supplied is not specifically limited, it is preferably supplied in an amount such that it always covers the surface of the polishing pad.

The polishing method according to the present invention can be carried out using a concentrated polishing liquid diluted with water or an aqueous solution. The dilution of the liquid may be carried out by, for example, laying a pipeline for supplying the concentrated liquid and a pipeline for supplying water or an aqueous solution so that they may meet each other to mix the liquids, and the diluted liquid may be supplied to the polishing pad. The liquids may be mixed by an ordinary method, such as by causing them to flow under pressure through narrow passages and then causing them to collide against each other, by filling a pipeline with a material such as a glass tube which separates and joins streams of the liquids repeatedly, or by installing a power-driven rotating blade in a pipeline.

Another method of dilution that can be employed in accordance with the present invention employs two mutually independent pipelines for supplying specified amounts of polishing liquid and water or an aqueous solution to the polishing pad and to rely on the relative motion of the polishing pad and the surface to be polished for mixing of the liquids.

According to still another method that is applicable to the present invention, certain amounts of polishing liquid and water or an aqueous solution are mixed in a single vessel to form a diluted mixture having an appropriate concentration and it is supplied to the polishing pad.

According to still another method that can be employed by the present invention, the polishing liquid is separated into at least two necessary constituents, water or an aqueous solution is added to those constituents to dilute them, and the liquid is supplied to the polishing pad. In this connection, it is preferable to supply constituent(s) including an oxidizing agent and constituent(s) including an organic acid according to the present invention separately from each other.

More specifically, the oxidizing agent is preferably employed as one constituent group (A), while the specific amino derivative, additives, surfactant, heterocyclic compound, abrasive grains and water are all made into another constituent group (B), and the constituent groups (A) and (B) are diluted with water or an aqueous solution before they are used. This arrangement requires three pipelines for supplying the constituent groups (A) and (B) and water or an aqueous solution, respectively, and those three pipelines may be connected together to form one pipeline leading to the polishing pad in which those constituents and water are mixed. It is alternatively possible to connect one of the three pipelines to the pipeline leading to the polishing pad after connecting the other two together. In this way, for example, it is possible to ensure a long mixing route and a long dissolving time for mixing the constituent containing the additives which are not easily dissolved, and then to connect the pipeline for water or an aqueous solution downstream thereof, and supply the polishing liquid.

It is also possible to lead all of the three pipelines to the polishing pad so that the constituents may be mixed by the relative motion of the pad and the surface to be polished, or it is also possible to mix the three constituents in a single vessel and then supply the mixed solution to the polishing pad. It is also possible that the metal-polishing liquid is a concentrated solution, with the diluting water supplied separately to the surface to be polished.

(Amount of the Polishing Liquid to be Supplied)

According to the polishing method of the present invention, the polishing liquid is supplied to the polishing platen at a rate of preferably from 50 to 500 ml/min. and more preferably from 100 to 300 ml/min.

(Polishing Pad)

The polishing pad which may be employed by the polishing method of the present invention is not specifically limited, and may be of the non-foamed or foamed type. The former is a pad formed from a hard bulk material of a synthetic resin, such as a plastic sheet. The latter includes a closed-cell foam (dry foam), an interconnected-cell foam (wet foam) and a two-layer composite (laminate), and particularly the two-layer composite (laminate) is preferred. The foam may be uniform or non-uniform.

The polishing pad according to the present invention may already contain abrasive grains (of e.g. ceria, silica, alumina or a resin) used for polishing. The pad may be a soft or hard one and the laminate is preferably of layers differing in hardness. The pad is preferably formed from e.g. a non-woven fabric, an artificial leather, polyamide, polyurethane, polyester or polycarbonate. It may have e.g. a grid of grooves, holes, or concentric or spiral grooves formed in its surface adapted to contact the surface to be polished.

Description will now be made of the material to be polished by the polishing method according to the present invention (substrate or wafer).

(Metallic Wiring Material)

The material to be polished in accordance with the present invention is preferably a substrate (wafer) having wiring connections formed from copper or a copper alloy. A copper alloy containing silver is more suitable than any other copper alloy as a metallic wiring material. The copper alloy produces an excellent result when it has a silver content of 10% by mass or less, and particularly 1% by mass or less, and it produces the most excellent result when it has a silver content of 0.00001 to 0.1% by mass.

(Wire Thickness)

The material to be polished in accordance with the present invention preferably has a wire thickness, by a half pitch of 0.15 μm or less, more preferably 0.10 μm or less and still more preferably 0.08 μm or less in the case of, for instance, DRAM device.

It preferably has a wire thickness of 0.12 μm or less, more preferably 0.09 μm or less and still more preferably 0.07 μm or less in the case of MPU device.

The polishing liquid according to the present invention produces a particularly good result on the material having such wiring.

(Metallic Barrier Material)

The material to be polished in accordance with the present invention has a barrier layer formed between copper wiring and an insulating film (including an interlayer insulating film) for preventing the diffusion of copper. The barrier layer is preferably formed from a metallic material of low resistance, such as TiN, TiW, Ta, TaN, W or WN, and more preferably from Ta or TaN.

Hereinafter, exemplary embodiments of the invention will be listed.

<1> A metal-polishing liquid used for chemical-mechanical polishing of a conductor film of copper or a copper alloy in a process for manufacturing a semiconductor device, the metal-polishing liquid comprising: (1) an amino acid derivative represented by the formula (I); and (2) a surfactant,

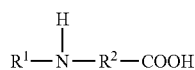
(I)

wherein, in the formula (I), $R^1$ represents an alkyl group having 1 to 4 carbon atoms and $R^2$ represents an alkylene group having 1 to 4 carbon atoms.

<2> The metal-polishing liquid according to <1>, wherein the amino acid derivative represented by the formula (I) is at least one of the group consisting of N-methylglycine, N-methylalanine and N-ethylglycine.

<3> The metal-polishing liquid according to <1> or <2>, wherein the surfactant is an anionic surfactant.

<4> The metal-polishing liquid according to any of <1> to <3>, wherein the surfactant is a sulfonic acid or a sulfonic acid salt.

<5> The metal-polishing liquid according to any of <1> to <4>, wherein the surfactant includes an aryl group.

<6> The metal-polishing liquid according to <1> to <5>, wherein the surfactant includes a phenyl group.

<7> The metal-polishing liquid in set forth in any of <1> to <6>, wherein the surfactant includes an alkyl group.

<8> The metal-polishing liquid according to any of <1> to <7>, wherein the surfactant is an alkyl diphenyl ether monosulfonic acid or an alkyl diphenyl ether monosulfonic acid salt.

<9> The metal-polishing liquid according to any of <1> to <8>, wherein the surfactant is an alkyl diphenyl ether disulfonic acid or an alkyl diphenyl ether disulfonic acid salt.

<10> The metal-polishing liquid according to any of <1> to <9>, wherein the surfactant is a mixture of an alkyl diphenyl ether monosulfonic acid or an alkyl diphenyl ether monosulfonic acid salt with an alkyl diphenyl ether disulfonic acid or an alkyl diphenyl ether disulfonic acid salt.

<11> The metal-polishing liquid according to <1> or <2>, wherein the surfactant is a nonionic surfactant.

<12> The metal-polishing liquid according to <11>, wherein the surfactant is a silicone surfactant.

<13> The metal-polishing liquid according to <12>, wherein the surfactant is a polyether-modified silicone surfactant having an ether bond at a side chain or a terminal thereof.

<14> The metal-polishing liquid according to <12> or <13>, wherein the surfactant is a polyether-modified silicone surfactant having an HLB value that is 8 or more but is less than 20.

<15> The metal-polishing liquid according to any of <1> to <14>, further containing an oxidizing agent.

<16> The metal-polishing liquid according to any of <1> to <15>, wherein the pH thereof is from 4 to 11.

<17> The metal-polishing liquid according to any of <1> to <16>, wherein the surface tension thereof is less than 55 mN/m.

<18> The metal-polishing liquid according to any of <1> to <17>, wherein the surface tension is less than 55 mN/m when a content of the surfactant is adjusted to $3\times10^{-3}$% by mass.

<19> The metal-polishing liquid according to <18>, wherein the surface tension is less than 50 mN/m when the content of the surfactant is adjusted to $3\times10^{-3}$% by mass.

<20> The metal-polishing liquid according to any of <1> to <19>, wherein the concentration of iron ions is less than 1 ppm.

<21> The metal-polishing liquid according to <20>, wherein the concentration of the iron ions is less than 0.3 ppm.

<22> The metal-polishing liquid according to any of <1> to <21>, containing an aromatic heterocyclic compound having three or more nitrogen atoms.

<23> The metal-polishing liquid according to <22>, wherein the aromatic heterocyclic compound is at least one compound selected from the group consisting of triazole and triazole derivatives, tetrazole and tetrazole derivatives, and benzotriazole and benzotriazole derivatives.

<24> The metal-polishing liquid as set forth at any of <1> to <23>, further comprising at least one kind of abrasive grains selected from the group consisting of ceria particles, silica particles, alumina particles and organic-inorganic composite particles.

<25> A chemical and mechanical polishing method in a process for manufacturing a semiconductor device, the method comprising for polishing a substrate having a conductor film of copper or a copper alloy by using a metal-polishing liquid according to any one of <1> to <24>.

<26> The polishing method according to <25>, wherein the surface to be polished is polished by moving a polishing pad attached to a polishing platen and the surface to be polished relative to each other, while supplying the metal-polishing liquid to the polishing pad.

EXAMPLES

Hereinafter, the present invention will be more specifically described with reference to examples. The invention is not restricted to the examples.

<Preparation of Abrasive Grains (Particles)>

-Preparation of Particular Colloidal Silica (D-1) and (D-2)-

The particular colloidal silica (D-1) was prepared as follows.

Ammonium water was added to 1000 g of an aqueous dispersion of 20% by mass of colloidal silica having an average abrasive grain size of 25 nm, to adjust the pH to 9.0, while agitating at room temperature, followed by slowly adding 15.9 g of a sodium aluminate aqueous solution of which $Al_2O_3$ concentration is 3.6% by mass and $Na_2O/Al_2O_3$ molar ratio is 1.50 over for 30 min, further followed by agitating for 0.5 hr. An obtained sol was charged in a SUS autoclave apparatus, after heating at 130° C. for 4 hr, passed through overnight a column packed with a hydrogen-type strongly acidic cation exchange resin (trade name: Amberlite IR-120B) and a column packed with a hydroxy group-type strongly basic anion exchange resin (trade name: Amberlite IRA-410) at a space rate of $1\ h^{-1}$ at room temperature, and an initial fraction was cut.

The particular colloidal silica (D-2) was prepared as follows.

In the preparation of the particular colloidal silica (D-1), without heating, an obtained sol was passed through overnight a column packed with a hydrogen-type strongly acidic cation exchange resin (trade name: Amberlite IR-120B) and a column packed with a hydroxy group-type strongly basic anion exchange resin (trade name: Amberlite IRA-410) at a space rate of $1\ h^{-1}$ at room temperature, and an initial fraction was cut.

According to the above methods, the particular colloidal silica (D-1) and (D-2) shown in Table 1 were prepared. The particular colloidal silica (D-1) and (D-2) did not show, after the preparation, the thickening and gelation.

TABLE 1

| Particular Colloidal Silica | Primary Grain Diameter (nm) | Surface Modifier | Number of Introduced Aluminum Atoms/ Number of Surface Silicon Atom Sites (%) |
|---|---|---|---|
| D-1 | 25 | Sodium Aluminate | 15 |
| D-2 | 25 | Sodium Aluminate | 15 |

Examples 1 to 9 and Comparative Examples 1 to 4

Polishing liquids 101 to 109 and 201 to 204 were prepared as shown in Table 2 below, and were subjected to polishing tests and evaluated.

(Preparation of Metal-Polishing Liquids)

Each metal-polishing liquid was prepared by mixing the materials as listed below. "A-1" and "B-1" in the column of Particular Amino Acid Derivatives and Comparative Compounds in Table 2 (and Table 3 below) refer to Exemplary Compounds A-1 and B-1, respectively, of particular amino acid derivatives as shown before.

Surfactant: Compound as shown in Table 2 (in the amount shown in Table 2, except Polishing Liquid 204 which does not contain any surfactant);
Abrasive grains: Colloidal silica as shown in Table 2        1.6 g;
Organic acid: Particular amino acid derivative or        0.25 mol;
comparative compound
(compound as shown in Table 2)
Heterocyclic compound: 1,2,3,4 tetrazole        1.5 mmol;
(Polishing Liquids 101 to 107, and 109)
Heterocyclic compound: Benzotriazole        1 mmol;
(Polishing Liquid 108)
Oxidizing agent: Hydrogen peroxide        13.5 g;

Pure water was added to the above materials to make a total volume of 1,000 ml and ammonia water was added to the mixture to adjust its pH to 7.5.

Another colloidal silica that was not the particular colloidal silica was also employed. It was colloidal silica not having any aluminum atom substituted for any silicon atom in its surface (PL2, trade name, produced by Fuso Kagaku Kogyo having an average abrasive grain size (primary particle diameter) of 25 nm and an association degree of 2). It is shown as non-particular colloidal silica in Table 2 (and Table 3).

In Table 2, Polishing Liquid 106 is shown as containing D-1 and cerium oxide as abrasive grains. More specifically, it contains 1.2 g of D-1 and 0.4 g of cerium oxide.

<Evaluation>

(Polishing Speed)

Polishing tests were conducted under the conditions shown below to examine the polishing speed and dishing. The results are shown in Table 2.

Polishing apparatus: FREX300 (trade name, produced by Ebara Seisakusho);

Material to be polished (wafer):

(1) For calculation for the polishing speed: A blanket wafer having a diameter of 300 mm, made by forming a 1.5 μm thick copper film formed on a silicon substrate;

(2) For evaluation for dishing: A wafer having a diameter of 300 mm and having copper wiring formed thereon (patterned wafer) (Mask pattern 754CMP (ATDF)).

Polishing pad: IC1400-K Groove (trade name, produced by Rodel);

Polishing conditions:

Polishing pressure (contacting pressure between the surface to be polished and the polishing pad): 14,000 Pa Polishing liquid supplying rate: 200 ml/min.

Polishing platen rotational frequency: 104 rpm

Polishing head rotational frequency: 85 rpm (Method of Evaluation)

Calculation of the polishing speed: Each blanket wafer (1) was polished for 60 seconds, the difference in thickness of the metal film between the wafer to be polished and the polished wafer was calculated from values of electrical resistance at each of 49 points uniformly spaced apart on the wafer, this was divided by the polishing time, and the average of the results was set to be the polishing speed.

(Dishing)

Each pattern wafer (2) was polished for the time required to remove copper completely from the non-wired area plus an extra 25% of that time, and step heights between lines (10 μm) and spaces (10 μm) was determined by a contact type surface profiler, Dektak V 3201 (trade name, produced by Veeco).

TABLE 2

| | Polishing liquid number | Surfactant Agent | Amount (g) | Abrasive grains Type | Particular amino acid derivative or comparative compound Type | Polishing speed (nm/min) | Dishing (nm) |
|---|---|---|---|---|---|---|---|
| Example 1 | Polishing liquid 101 | Dodecyl diphenyl ether monosulfonic acid | 0.003 | D-1 | A-1 | 777 | 31 |
| Example 2 | Polishing liquid 102 | Dodecyl diphenyl ether disulfonic acid | 0.003 | D-1 | A-1 | 742 | 38 |
| Example 3 | Polishing liquid 103 | Mixture of dodecyl diphenyl ether disulfonic acid and dodecyl diphenyl ether monosulfonic acid (molar ratio = 70:30) | 0.003 | D-1 | A-1 | 800 | 42 |
| Example 4 | Polishing liquid 104 | Mixture of dodecyl diphenyl ether disulfonic acid and dodecyl diphenyl ether monosulfonic acid (molar ratio = 50:50) | 0.003 | D-1 | A-1 | 719 | 39 |
| Example 5 | Polishing liquid 105 | Polyoxyethylene polyoxypropylene glycol | 0.001 | D-2 | A-1 & B-2 (A-1:B-2 = 1:1 (molar)) | 789 | 49 |
| Example 6 | Polishing liquid 106 | Mixture of dodecyl diphenyl ether disulfonic acid and dodecyl diphenyl ether monosulfonic acid (molar ratio = 70:30) | 0.003 | D-1 Cerium oxide | C-1 | 821 | 49 |
| Example 7 | Polishing liquid 107 | N,N-dimethyldodecylamine = N-oxide | 0.002 | D-2 | B-2 & β-aranine (B-2:β-aranine = 1:1 (molar)) | 715 | 31 |
| Example 8 | Polishing liquid 108 | Dodecyl diphenyl ether sulfonic acid Polypropylene glycol | 0.002 0.001 | D-1 | A-1 | 724 | 48 |
| Example 9 | Polishing liquid 109 | Dodecyl diphenyl ether monosulfonic acid | 0.004 | Non-particular colloidal silica | A-1 | 770 | 51 |
| Comparative Example 1 | Polishing liquid 201 | Dodecyl diphenyl ether monosulfonic acid | 0.003 | D-1 | Dihydroxyethylglycine | 772 | 100 |
| Comparative Example 2 | Polishing liquid 202 | Dodecyl diphenyl ether monosulfonic acid | 0.003 | D-1 | Quinaldic acid | 702 | 82 |
| Comparative Example 3 | Polishing liquid 203 | Mixture of dodecyl diphenyl ether disulfonic acid and dodecyl phenyl ether monosulfonic acid (molar ratio = 70:30) | 0.003 | Non-particular colloidal silica | Dihydroxyethylglycine | 760 | 119 |
| Comparative Example 4 | Polishing liquid 204 | — | — | D-1 | Quinaldic acid | 719 | 256 |

It is obvious from Table 2 that the chemical-mechanical polishing method employing the metal-polishing liquid according to the present invention (i.e. the polishing method according to the present invention) makes it possible to achieve both a high polishing speed of 700 nm/min. or more, with a low degree of dishing. It is to be noted in particularly that the present invention produces an outstanding result by including aminocarboxylic acid, when employing a surfactant of a mixture of alkyl diphenyl ether disulfonic acid and alkyl diphenyl ether monosulfonic acid and when the amount of the above surfactant is from 0.001 to 0.01% by mass.

Examples 10 to 18 and Comparative Examples 5 to 10

Polishing liquids 110 to 118 and 205 to 210 were prepared in the same way as Polishing Liquid 101 except that the surfactant, abrasive grains, organic acid, heterocyclic compound and oxidizing agent in Polishing Liquid 101 were changed to those shown below. Polishing Liquids 110 to 118 and 205 to 210 were evaluated in the same way as in Example 1 and the surface tension of each liquid was determined. The results are shown in Table 3. In Table 3, Surface tension[1] represents a surface tension of the metal-polishing liquid per se and Surface tension[2] represents a surface tension of the metal-polishing liquid whose surfactant was adjusted to $3 \times 10^{-3}$% by mass.

| | |
|---|---|
| Surfactant: Compound as shown in Table 3 (in the amount shown in Table 3); | |
| Abrasive grains: Colloidal silica as shown in Table 3; | 1.6 g |
| Organic acid: Particular amino acid derivative or comparative compound (Compound as shown in Table 3) | 0.25 mol; |
| Heterocyclic compound: 1,2,3,4-tetrazole (Polishing Liquids 101 to 107 and 109); | 1.5 mmol |
| Heterocyclic compound: Benzotriazole (Polishing Liquids 110 to 118 and 205 to 210) | 1 mmol |
| Oxidizing Agent: Hydrogen peroxide | 13.5 g |

TABLE 3

| | Polishing liquid number | Surfactant Agent | Amount (g) | Abrasive grains Type | Particular amino acid derivative or comparative compound Type | Surface tension[1] (mN/m) | Surface tension[2] (mN/m) | Polishing speed (nm/min) | Dishing (nm) |
|---|---|---|---|---|---|---|---|---|---|
| Example 10 | Polishing liquid 110 | Polyoxyethylene-methylpolysiloxane copolymer (HLB: 14.5) | 0.003 | D-1 | A-1 | 52 | 45 | 748 | 37 |
| Example 11 | Polishing liquid 111 | Polyoxyethylene-methylpolysiloxane copolymer (HLB: 10) | 0.001 | Non-Particular colloidal silica | B-2 | 54 | 35 | 703 | 41 |

TABLE 3-continued

| Polishing liquid number | Surfactant Agent | Amount (g) | Abrasive grains Type | Particular amino acid derivative or comparative compound Type | Surface tension[1] (mN/m) | Surface tension[2] (mN/m) | Polishing speed (nm/min) | Dishing (nm) |
|---|---|---|---|---|---|---|---|---|
| Example 12 | Polishing liquid 112 | Poly(oxyethyleneoxypropylene)-methyl-polysiloxane copolymer (HLB: 13) | 0.003 | Non-Particular colloidal silica | B-2 | 51 | 42 | 721 | 36 |
| Example 13 | Polishing liquid 113 | Poly(oxyethyleneoxypropylene)-methyl-polysiloxane copolymer (HLB: 12) | 0.003 | Non-Particular colloidal silica | B-2 | 51 | 42 | 708 | 33 |
| Example 14 | Polishing liquid 114 | Poly(oxyethyleneoxypropylene)-methyl-polysiloxane copolymer (HLB: 16) | 0.004 | Non-Particular colloidal silica | B-2 | 55 | 49 | 742 | 32 |
| Example 15 | Polishing liquid 115 | Poly(oxyethyleneoxypropylene)-methyl-polysiloxane copolymer (HLB: 16) | 0.004 | Non-Particular colloidal silica | A-2 | 55 | 49 | 683 | 45 |
| Example 16 | Polishing liquid 116 | Poly(oxyethyleneoxypropylene)-methyl-polysiloxane copolymer (HLB: 16) | 0.004 | Non-Particular colloidal silica | B-1 | 55 | 49 | 756 | 38 |
| Example 17 | Polishing liquid 117 | Poly(oxyethyleneoxypropylene)-methyl-polysiloxane copolymer (HLB: 16) | 0.004 | Non-Particular colloidal silica | C-1 | 55 | 49 | 717 | 42 |
| Example 18 | Polishing liquid 118 | Poly(oxyethyleneoxypropylene)-methyl-polysiloxane copolymer (HLB: 16) | 0.004 | Non-Particular colloidal silica | C-2 | 55 | 49 | 681 | 38 |
| Comparative Example 5 | Polishing liquid 205 | Poly(oxyethyleneoxypropylene)-methyl-polysiloxane copolymer (HLB: 16) | 0.004 | Non-Particular colloidal silica | Dihydroxyethyl glycine | 55 | 49 | 733 | 96 |
| Comparative Example 6 | Polishing liquid 206 | Polyoxyethylene-methylpolysiloxane copolymer (HLB: 14.5) | 0.003 | D-1 | Quinaldic acid | 52 | 45 | 701 | 87 |
| Comparative Example 7 | Polishing liquid 207 | Poly(oxyethyleneoxypropylene)-methyl-polysiloxane copolymer (HLB: 12) | 0.003 | D-1 | Oxalic acid | 51 | 42 | 862 | 320 |
| Comparative Example 8 | Polishing liquid 208 | Polyoxyethylene-methylpolysiloxane copolymer (HLB: 10) | 0.001 | D-1 | Malic acid | 54 | 35 | 806 | 125 |
| Comparative Example 9 | Polishing liquid 209 | Poly(oxyethyleneoxypropylene)-methyl-polysiloxane copolymer (HLB: 16) | 0.004 | D-1 | Maleic acid | 55 | 49 | 763 | 104 |
| Comparative Example 10 | Polishing liquid 210 | Poly(oxyethyleneoxypropylene)-methyl-polysiloxane copolymer (HLB: 16) | 0.004 | D-1 | Tartaric acid | 55 | 49 | 748 | 136 |

It is obvious from Table 3 that the chemical-mechanical polishing method employing the metal-polishing liquid according to the present invention (i.e. the polishing method according to the present invention) makes it possible to achieve both a high polishing speed of 650 nm/min. or above and a low degree of dishing.

It has also been found by another experiment that polishing with a metal-polishing liquid having an iron ion concentration of 1 ppm or above has a lower polishing speed if this liquid is used after it has been left to stand at room temperature for a week.

It has also been found that the metal-polishing liquid of the present invention containing a silicone surfactant has the unexpected result that copper wiring remaining after polishing is reduced.

According to the invention, a metal-polishing liquid that has rapid CMP speed and excellent copper/tantalum polishing selectivity and is less in the dishing to be able to improve the planarity of a surface to be polished and a polishing method therewith may be provided.

All publications, patent applications, and technical standards mentioned in this specification are herein incorporated by reference to the same extent as if each individual publication, patent application, or technical standard was specifically and individually indicated to be incorporated by reference.

What is claimed is:

1. A metal-polishing liquid used for chemical-mechanical polishing of a conductor film of copper or a copper alloy in a process for manufacturing a semiconductor device, the metal-polishing liquid comprising: (1) an amino acid derivative represented by the formula (I); and (2) a surfactant,

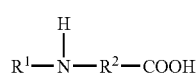

wherein, in the formula (I), $R^1$ represents an alkyl group having 1 to 4 carbon atoms and $R^2$ represents an alkylene group having 1 to 4 carbon atoms, wherein the surfactant is an alkyl diphenyl ether monosulfonic acid or an alkyl diphenyl ether monosulfonic acid salt, and wherein the metal-polishing liquid further comprises colloidal silica particles in which at least part of silicon atoms on the surface thereof are modified with aluminum atoms.

2. The metal-polishing liquid according to claim 1, wherein the amino acid derivative represented by the formula (I) is at least one selected from the group consisting of N-methylalanine and N-ethylglycine.

3. The metal-polishing liquid according to claim 1, wherein the surfactant is a mixture of an alkyl diphenyl ether monosulfonic acid or an alkyl diphenyl ether monosulfonic acid salt with an alkyl diphenyl ether disulfonic acid or an alkyl diphenyl ether disulfonic acid salt.

4. The metal-polishing liquid according to claim 1, further containing an oxidizing agent.

5. The metal-polishing liquid according to claim 1, wherein the pH thereof is from 4 to 11.

6. The metal-polishing liquid according to claim 1, wherein the surface tension thereof is less than 55 mN/m.

7. The metal-polishing liquid according to claim 1, wherein the surface tension thereof is less than 55 mNm when a content of the surfactant is adjusted to $3\times10^{-3}$% by mass.

8. The metal-polishing liquid according to claim 7, wherein the surface tension is less than 50 mNm when the content of the surfactant is adjusted to $3\times10^{-3}$% by mass.

9. The metal-polishing liquid according to claim 1, wherein the concentration of iron ions is less than 1 ppm.

10. The metal-polishing liquid according to claim 9, wherein the concentration of the iron ions is less than 0.3 ppm.

11. The metal-polishing liquid according to claim 1, containing an aromatic heterocyclic compound having three or more nitrogen atoms.

12. The metal-polishing liquid according to claim 11, wherein the aromatic heterocyclic compound is at least one compound selected from the group consisting of triazole and triazole derivatives, tetrazole and tetrazole derivatives, and benzotriazole and benzotriazole derivatives.

13. The metal-polishing liquid according to claim 1, further comprising at least one kind of abrasive grain selected from the group consisting of ceria particles, silica particles, alumina particles and organic-inorganic composite particles.

14. A chemical and mechanical polishing method in a process for manufacturing a semiconductor device, the method comprising polishing a substrate having a conductor film of copper or a copper alloy by using a metal-polishing liquid according to claim 1.

15. The polishing method according to claim 14, wherein the surface to be polished is polished by moving a polishing pad attached to a polishing platen and the surface to be polished relative to each other, while supplying the metal-polishing liquid to the polishing pad.

* * * * *